US008725442B2

(12) United States Patent
Kondo et al.

(10) Patent No.: US 8,725,442 B2
(45) Date of Patent: May 13, 2014

(54) METHOD FOR MEASURING SYSTEM PARAMETER OF LINEAR MULTIPORT AND MEASURING METHOD USING VECTOR NETWORK ANALYZER

(75) Inventors: Hajime Kondo, Toyko (JP); Toshiyuki Yakabe, Tokyo (JP); Hatsuo Yabe, Tokyo (JP)

(73) Assignees: The University of Electro-Communications, Tokyo (JP); Campus Creat Co., Ltd., Tokyo (JP)

( * ) Notice: Subject to any disclaimer, the term of this patent is extended or adjusted under 35 U.S.C. 154(b) by 373 days.

(21) Appl. No.: 13/147,575

(22) PCT Filed: Feb. 2, 2010

(86) PCT No.: PCT/JP2010/051394
§ 371 (c)(1),
(2), (4) Date: Aug. 2, 2011

(87) PCT Pub. No.: WO2010/090173
PCT Pub. Date: Aug. 12, 2010

(65) Prior Publication Data
US 2011/0288800 A1 Nov. 24, 2011

(30) Foreign Application Priority Data

Feb. 4, 2009 (JP) ................................ 2009-023816

(51) Int. Cl.
*G01R 27/28* (2006.01)
(52) U.S. Cl.
CPC ..................................... *G01R 27/28* (2013.01)
USPC .......................................................... 702/66
(58) Field of Classification Search
CPC ...................................................... G01R 27/28
USPC .......................................................... 702/66
See application file for complete search history.

(56) References Cited

U.S. PATENT DOCUMENTS 4,104,583 A   8/1978   Engen
(Continued)

FOREIGN PATENT DOCUMENTS

JP    2003/215183 A    7/2003
JP    2005/221375 A    8/2005
(Continued)

OTHER PUBLICATIONS

International Search Report mailed Mar. 9, 2010, for PCT/JP2010/051394, 2 pages.
Cronson et al., "A New Calibration Technique for Automated Broadband Microwave Measurements," IEEE 6th European Microwave Conference, Italy, 1976, pp. 205-209.

(Continued)

*Primary Examiner* — Bryan Bui
(74) *Attorney, Agent, or Firm* — Seed IP Law Group PLLC

(57) ABSTRACT

The present invention provides a novel measurement method for system parameters of a 5-port junction used in a VNA (Vector Network Analyzer). A VNA is a device for measuring amplitude ratios and phase differences (S-parameters: scattering matrix elements) between incident waves and reflected waves of a DUT (Device Under Test), or between input waves and transmitted waves. What has been newly discovered is that for 5 ports, S-parameters can be expressed by a linear coupling using H and power difference ratios ({P(S)/P(0)}−1). It is possible to easily calculate parameter H using a minimum of three already known standards, and amount of calculation can be reduced compared to conventionally.

9 Claims, 15 Drawing Sheets

(56) References Cited

U.S. PATENT DOCUMENTS

| | | | |
|---|---|---|---|
| 8,155,904 B2* | 4/2012 | Dvorak et al. | 702/66 |
| 8,508,241 B2* | 8/2013 | Heuermann | 324/637 |
| 2010/0017669 A1 | 1/2010 | Fujii et al. | |

FOREIGN PATENT DOCUMENTS

| | | |
|---|---|---|
| JP | 2005/326308 A | 11/2005 |
| JP | 2006112893 A | 4/2006 |
| JP | 2008164418 A | 7/2008 |
| JP | 2009068932 A | 4/2009 |
| WO | 2008065791 A1 | 6/2008 |

OTHER PUBLICATIONS

Ghannouchi et al., "The Six-Port Reflectometer and its Complete Calibration by Four Standard Terminations," IEE Proceedings H 135(4): 285-288, Aug. 1988.

Hirose et al., "A Five-Port Based VNA," Proceedings of the IEICE Conference, vol. 2008 Electronics 1, Nippon, 2008, p. 161.

Li et al., "The Measurement of Complex Reflection Coefficient by Means of a Five-Port Reflectometer," IEEE Transactions on Microwave Theory and Techniques MTT 31(4): 321-326, Apr. 1983.

Yakabe et al., "Complete Calibration of a Six-Port Reflectometer with One Sliding Load and One Short," IEEE Transactions on Microwave Theory and Techniques 42(11): 2035-2039, Nov. 1994.

* cited by examiner

METHOD FOR MEASURING SYSTEM PARAMETER OF LINEAR MULTIPORT AND MEASURING METHOD USING VECTOR NETWORK ANALYZER

TECHNICAL FIELD

The present invention relates to technology for measuring amplitude ratios and phase differences of signals, in a high frequency region (particularly the microwave band, millimeter waveband and sub-millimeter waveband) and in a light region (infra-red, visible light and ultra-violet)).

BACKGROUND ART

In the research and development of devices, circuits, and units that operate in the microwave band, measurement of phase differences between input signals to the devices, circuits, and units is indispensable. Conventionally, a VNA (Vector Network Analyzer) has fulfilled that role. A VNA is a device for measuring incident waves and reflected waves of a DUT (Device Under Test), or amplitude ratios and phase differences (S-parameters: scattering matrix elements) between incident waves and transmitted waves.

Conventionally a heterodyne type has been used as this sort of VNA. With the heterodyne type, measurement of an input signal is carried out by dropping the frequency of an input signal to an intermediate frequency using a local oscillator and a mixer.

However, with the heterodyne type high component accuracy is required, which often results in the device becoming expensive. Also, if the frequency of an input signal becomes high, there is a problem in that it becomes difficult to generate an intermediate frequency.

As means of solving these types of problems, a homodyne method has been proposed (refer to patent document 1 mentioned below). A six-port reflectometer is disclosed in this document. This is for calculating amplitude ratios and phase difference for two waves using system inherent hardware information obtained by calibration (calibration parameters) and a plurality of power measurement values (scalar quantities). According to this device and the measurement method using this device, phase differences for which high precision measurement would conventionally become difficult as the frequency becomes high can be obtained based on the measurement of scalar quantities of power which are basic measured quantities in electromagnetic wave measurement where measurement precision has almost no dependence on frequency. According to this technology, without being burdened by the demands of conventional high precision hardware, four power measurements and imperfections in hardware can be corrected with software (i.e. system parameters) known as calibration. A reflectometer is a unit for, for a single wave (signal), comparing an incident wave and reflected wave of that single wave.

Further, the present inventor has developed the technology of this publication to propose technology for composing a correlator (patent publications 2 to 7 below). A correlator (wave-correlator) is a unit that compares incident wave and reflected wave for two independent waves (of the same frequency), that is, measures complex amplitude ratios.

PRIOR ART DOCUMENTS

Patent Documents

Patent Document 1: U.S. Pat. No. 4,104,583
Patent Document 2: Japanese patent laid-open No. 2003-215183
Patent Document 3: Japanese Patent Laid-open No. 2005-221375
Patent Document 4: Japanese Patent Laid-open No. 2005-326308
Patent Document 5: Japanese Patent Laid-open No. 2006-112893
Patent Document 6: Japanese Patent Laid-open No. 2008-164418
Patent Document 7: Japanese Patent Laid-open No. 2009-68932

DISCLOSURE OF THE INVENTION

With the previously described homodyne type VNA, a system parameter known as parameter T is acquired beforehand, and S-parameters of a DUT are obtained using this system parameter. In conventional idiom, a system parameter of a reflectometer is called parameter K and a system parameter of a correlator is called parameter T, and in this specification a system parameter of a homodyne type VNA will be uniformly called parameter T. In order to obtain this parameter T, it is necessary to calculate three circular cross points on a complex plane using the output of each port (refer to FIG. 21 of patent document 7). With this method, therefore, there tends to be a large amount of calculation. There is also a problem that three circular intersections cannot always be obtained.

The present invention has been made based on the novel finding that S-parameters of a DUT can be expressed by linear combinations using system parameter H and power difference ratios. Here, the system parameter H is a new parameter set by the present inventors.

Specifically, the present invention has as its object to provide technology for measuring amplitude ratios and phase differences of high frequency signals using a vector network analyzer, using a method that is different from the methods of the above-described related art documents, in order to solve the above described problems. Further, an object of the present invention is to provide a method for measuring a new system parameter, and a measuring method and program that utilize a vector network analyzer using this new system parameter measuring method.

This invention is a method for, in a linear multiport including a first input port and a second input port, a third output port at which an output wave that is a linear combination of an input wave from the first input port and an input wave from the second input port respectively appears, and a fourth output port and a fifth output port, measuring system parameters $H3\_11$, $H4\_11$, and $H5\_11$ that are values inherent to the multiport, comprising:

a reference power measurement step of inputting a specified wave (to give a specific example, a wave output from one output terminal (reference numeral R) of an power divider PD such as shown in FIG. 4 and FIG. 9) to the first input port, measuring power of the third output port, the fourth output port and the fifth output port with the second input port in a matched terminated state, and respectively making the powers P3(0), P4(0) and P5(0), a power measurement step of removing the matched termination of the second input port, connecting a short standard (In standard devices, transmission characteristic and reflection characteristic are already known. The same applies below.) to the second input port, inputting another specified wave (to give a specific example, a wave output from another output terminal (reference numeral M) of an power divider PD such as shown in FIG. 4 and FIG. 9) into the short standard, measuring power of the third output port, the fourth output port and the fifth output port with a reflected wave of the other specified wave input to the second input port, and respectively making the powers P3(S11_s[1]), P4(S11_s[1]) and P5(S11_s[1]), a power measurement step of inserting a line 1 standard before the short standard of the second input port, inputting the other specified wave into the line 1 standard and the short standard, measuring power of the third output port, the fourth output port and the fifth output port with a reflected wave of the other specified wave input to the second input port, and respectively making the powers P3(S11_s[2]), P4(S11_s[2]) and P5(S11_s[2]), a power measurement step of inserting a line 2 standard instead of the line 1 standard of the second input port, inputting the other specified wave to the line 2 standard and the short standard, measuring power of the third output port, the fourth output port and the fifth output port with a reflected wave of the other specified wave input to the second input port, and respectively making the powers P3(S11_s[3]), P4(S11_s[3]) and P5(S11_s[3]), and calculating the system parameters H3_11, H4_11, H5_11 from the following equation:

One aspect of this invention is a method for, in a linear multiport including a first input port and a second input port, a third output port at which an output wave that is a linear combination of an input wave from the first input port and an input wave from the second input port respectively appears, and a fourth output port and a fifth output port, measuring system parameters H3_12, H4_12, and H5_12 that are values inherent to the multiport, comprising:

a reference power measurement step of inputting a specified wave to the first input port, measuring power of the third output port, the fourth output port and the fifth output port with the second input port in a matched terminated state, and respectively making the powers P3(0), P4(0) and P5(0), a power measurement step of removing the matched termination of the second input port, measuring power of the third output port, the fourth output port and the fifth output port with another specified wave input to the second input port, and respectively making the powers P3(S12_s[1]), P4(S12_s[1]) and P5(S12_s[1]), a power measurement step of connecting a line 1 standard to the second input port, measuring power of the third output port, the fourth output port and the fifth output port with the other specified wave input via the line 1 standard, and respectively making the powers P3(S12_s[2]), P4(S12_s[2]) and P5(S12_s[2]), and a power measurement step of connecting a line 2 standard instead of the line 1 standard of the second input port, measuring power of the third output port, the fourth output port and the fifth output port with the other specified wave input via the line 2 standard, and respectively making the powers P3(S12_s[3]), P4(S12_s[3]) and P5(S12_s[3]), and calculating the system parameters H3_12, H4_12, H5_12 from the following equation:

$$\begin{bmatrix} H_{3\_11} \\ H_{4\_11} \\ H_{5\_11} \end{bmatrix} = \begin{bmatrix} \sum_{i=1}^{n}\left(\frac{P_3(S_{11\_s}[i])}{P_3(0)}-1\right)^2 & \sum_{i=1}^{n}\left(\frac{P_3(S_{11\_s}[i])}{P_3(0)}-1\right)\left(\frac{P_4(S_{11\_s}[i])}{P_4(0)}-1\right) & \sum_{i=1}^{n}\left(\frac{P_3(S_{11\_s}[i])}{P_3(0)}-1\right)\left(\frac{P_5(S_{11\_s}[i])}{P_5(0)}-1\right) \\ \sum_{i=1}^{n}\left(\frac{P_3(S_{11\_s}[i])}{P_3(0)}-1\right)\left(\frac{P_4(S_{11\_s}[i])}{P_4(0)}-1\right) & \sum_{i=1}^{n}\left(\frac{P_4(S_{11\_s}[i])}{P_4(0)}-1\right)^2 & \sum_{i=1}^{n}\left(\frac{P_4(S_{11\_s}[i])}{P_4(0)}-1\right)\left(\frac{P_5(S_{11\_s}[i])}{P_5(0)}-1\right) \\ \sum_{i=1}^{n}\left(\frac{P_3(S_{11\_s}[i])}{P_3(0)}-1\right)\left(\frac{P_5(S_{11\_s}[i])}{P_5(0)}-1\right) & \sum_{i=1}^{n}\left(\frac{P_4(S_{11\_s}[i])}{P_4(0)}-1\right)\left(\frac{P_5(S_{11\_s}[i])}{P_5(0)}-1\right) & \sum_{i=1}^{n}\left(\frac{P_5(S_{11\_s}[i])}{P_5(0)}-1\right)^2 \end{bmatrix}^{-1}$$

equation 1

$$\begin{bmatrix} \sum_{i=1}^{n}\left(\frac{P_3(S_{11\_s}[i])}{P_3(0)}-1\right)S_{11\_s}[i] \\ \sum_{i=1}^{n}\left(\frac{P_4(S_{11\_s}[i])}{P_4(0)}-1\right)S_{11\_s}[i] \\ \sum_{i=1}^{n}\left(\frac{P_5(S_{11\_s}[i])}{P_5(0)}-1\right)S_{11\_s}[i] \end{bmatrix}$$

$$\begin{bmatrix} H_{3\_12} \\ H_{4\_12} \\ H_{5\_12} \end{bmatrix} = \begin{bmatrix} \sum_{i=1}^{n}\left(\frac{P_3(S_{12\_s}[i])}{P_3(0)}-1\right)^2 & \sum_{i=1}^{n}\left(\frac{P_3(S_{12\_s}[i])}{P_3(0)}-1\right)\left(\frac{P_4(S_{12\_s}[i])}{P_4(0)}-1\right) & \sum_{i=1}^{n}\left(\frac{P_3(S_{12\_s}[i])}{P_3(0)}-1\right)\left(\frac{P_5(S_{12\_s}[i])}{P_5(0)}-1\right) \\ \sum_{i=1}^{n}\left(\frac{P_3(S_{12\_s}[i])}{P_3(0)}-1\right)\left(\frac{P_4(S_{12\_s}[i])}{P_4(0)}-1\right) & \sum_{i=1}^{n}\left(\frac{P_4(S_{12\_s}[i])}{P_4(0)}-1\right)^2 & \sum_{i=1}^{n}\left(\frac{P_4(S_{12\_s}[i])}{P_4(0)}-1\right)\left(\frac{P_5(S_{12\_s}[i])}{P_5(0)}-1\right) \\ \sum_{i=1}^{n}\left(\frac{P_3(S_{12\_s}[i])}{P_3(0)}-1\right)\left(\frac{P_5(S_{12\_s}[i])}{P_5(0)}-1\right) & \sum_{i=1}^{n}\left(\frac{P_4(S_{12\_s}[i])}{P_3(0)}-1\right)\left(\frac{P_5(S_{12\_s}[i])}{P_5(0)}-1\right) & \sum_{i=1}^{n}\left(\frac{P_5(S_{12\_s}[i])}{P_5(0)}-1\right)^2 \end{bmatrix}^{-1}$$

$$\begin{bmatrix} \sum_{i=1}^{n}\left(\frac{P_3(S_{12\_s}[i])}{P_3(0)}-1\right)S_{12\_s}[i] \\ \sum_{i=1}^{n}\left(\frac{P_4(S_{12\_s}[i])}{P_4(0)}-1\right)S_{12\_s}[i] \\ \sum_{i=1}^{n}\left(\frac{P_5(S_{12\_s}[i])}{P_5(0)}-1\right)S_{12\_s}[i] \end{bmatrix}$$

equation 2

Another aspect of the present invention is a measuring method using a vector network analyzer for dividing a wave from a power supply for generating a high frequency signal, such as microwave band, millimeter wave band, sub-millimeter wave band or infra-red light, visible light or ultraviolet light, into two waves, inputting one wave to a first input port of a linear multiport having two input ports and at least three output ports, inputting the other wave to a device under test, and also inputting a wave transmitted through the device under test, or a wave reflected by the device under test, to a second input port of the linear multiport, measuring respective detected outputs for at least three power measurement output ports of the linear multiport in this state, and measuring vector quantities relating to the device under test based on those results, the linear multiport including the first input port and the second input port, a third output port at which an output wave that is a linear combination of an input wave from the first input port and an input wave from the second input port appears, a fourth output port and a fifth output port, comprising:

a reference power measurement step of inputting a specified wave to the first input port, measuring power of the third output port, the fourth output port and the fifth output port with the second input port in a matched terminated state, and respectively making the powers P3(0), P4(0) and P5(0), a power measurement step of measuring power of the third output port, the fourth output port and the fifth output port where a wave that has been reflected by the device under test is input to the second input port, and respectively making the powers P3(S11), P4(S11) and P5(S11), and calculating a reflection characteristic S11 for the device under test based on P3(0), P4(0), and P5(0), P3(S11), P4(S11), and P5(S11), previously obtained parameters H3_11, H4_11, and H5_11, and the following equation:

$$S_{11} = H_{3\_11}\left(\frac{P_3(S_{11})}{P_3(0)}-1\right)+ \\ H_{4\_11}\left(\frac{P_4(S_{11})}{P_4(0)}-1\right)+H_{5\_11}\left(\frac{P_5(S_{11})}{P_5(0)}-1\right)$$

equation 3

Another aspect of the present invention is a measuring method using a vector network analyzer for dividing a wave from a power supply for generating a high frequency signal, such as microwave band, millimeter wave band, sub-millimeter wave band or infra-red light, visible light or ultraviolet light, into two waves, inputting one wave to a first input port of a linear multiport having two input ports and at least three output ports, inputting the other wave to a device under test, and also inputting a wave transmitted through the device under test, or a wave reflected by the device under test, to a second input port of the linear multiport, measuring respective detected outputs for at least three power measurement output ports of the linear multiport in this state, and measuring vector quantities relating to the device under test based on those results, the linear multiport including the first input port and the second input port, a third output port at which an output wave that is a linear combination of an input wave from the first input port and an input wave from the second input port appears, a fourth output port and a fifth output port, comprising:

a reference power measurement step of inputting a specified wave to the first input port, measuring power of the third output port, the fourth output port and the fifth output port with the second input port in a matched terminated state, and respectively making the powers P3(0), P4(0) and P5(0), a power measurement step of measuring power of the third output port, the fourth output port and the fifth output port where a wave that has been transmitted through the device under test is input to the second input port, and respectively making the powers P3(S12), P4(S12) and P5(S12), and calculating a transmission characteristic S12 for the device under test based on P3(0), P4(0), and P5(0), P3(S12), P4(S12), and P5(S12), previously obtained parameters H3_12, H4_12, and H5_12, and the following equation.

$$S_{12} = H_{3\_12}\left(\frac{P_3(S_{12})}{P_3(0)}-1\right)+ \\ H_{4\_12}\left(\frac{P_4(S_{12})}{P_4(0)}-1\right)+H_{5\_12}\left(\frac{P_5(S_{12})}{P_5(0)}-1\right)$$

equation 4

A vector network analyzer to which this invention will be applied comprises a voltage source for generating a high frequency signal of, for example, the microwave band, millimeter wave band, sub-millimeter wave band, or infra-red light, visible light or ultra-violet light, a power divider for splitting output of the power supply into at least two, a 5-port junction containing two input ports P1 and P1 respectively receiving waves divided by the power divider and three output ports P3 to P5 for power measurement, a detector for detecting waves output from the output ports P3 to P5 of the 5-port junction, and a switching mechanism provided between the power divider and the input port P2 of the 5-port junction, wherein the switching mechanism selects one of a first connection where a wave that has been split by the power divider is input to one port of the device under test and an output wave from the port is input to the input port P2, a second connection where a wave that has been split by the power divider is input to the other port of the device under test and a wave output from the one port is input to the input port P2, a third connection where a wave that has been split by the power divider is input to the one port of the device under test and a wave output from the other port is input to the input port P2, and a fourth connection where a wave that has been split by the power divider is input to the other port of the device under test and a wave output from the port is input to the input port P2.

For example, SW1 and SW2 of FIG. 4 constitute the switching mechanism.

Claim 1 and claim 3 may apply with the first connection and the fourth connection, for example, while claim 2 and claim 4 may apply with the second connection and the third connection, for example.

The S-parameter S22 can similarly apply the procedure for S11 of the present invention. That is, the measurement procedure for S11 may be used as the procedure for S22, by appropriately allocating port numbers, because how the port numbers are allocated is arbitrary. Similarly, as to the S-parameter S21, the procedure of S12 of the present invention may be similarly applied. As can be understood from the above, this also applies to system parameters H3_22, H4_22, and H5_22, and H3_21, H4_21, and H5_21.

Further, the present invention also relates to systems and non-transitory computer-readable recording media storing a computer program for realizing the above described measurement method.

BRIEF DESCRIPTION OF THE DRAWINGS

FIG. 15 is a drawing showing computation expressions for parameters H3_21, H4_21, and H5_21.

FIG. 16 is a drawing showing computation expressions for parameters H3_21, H4_21, and H5_21.

BEST MODE FOR CARRYING OUT THE INVENTION

Embodiment 1 of the Invention

Figure 1:
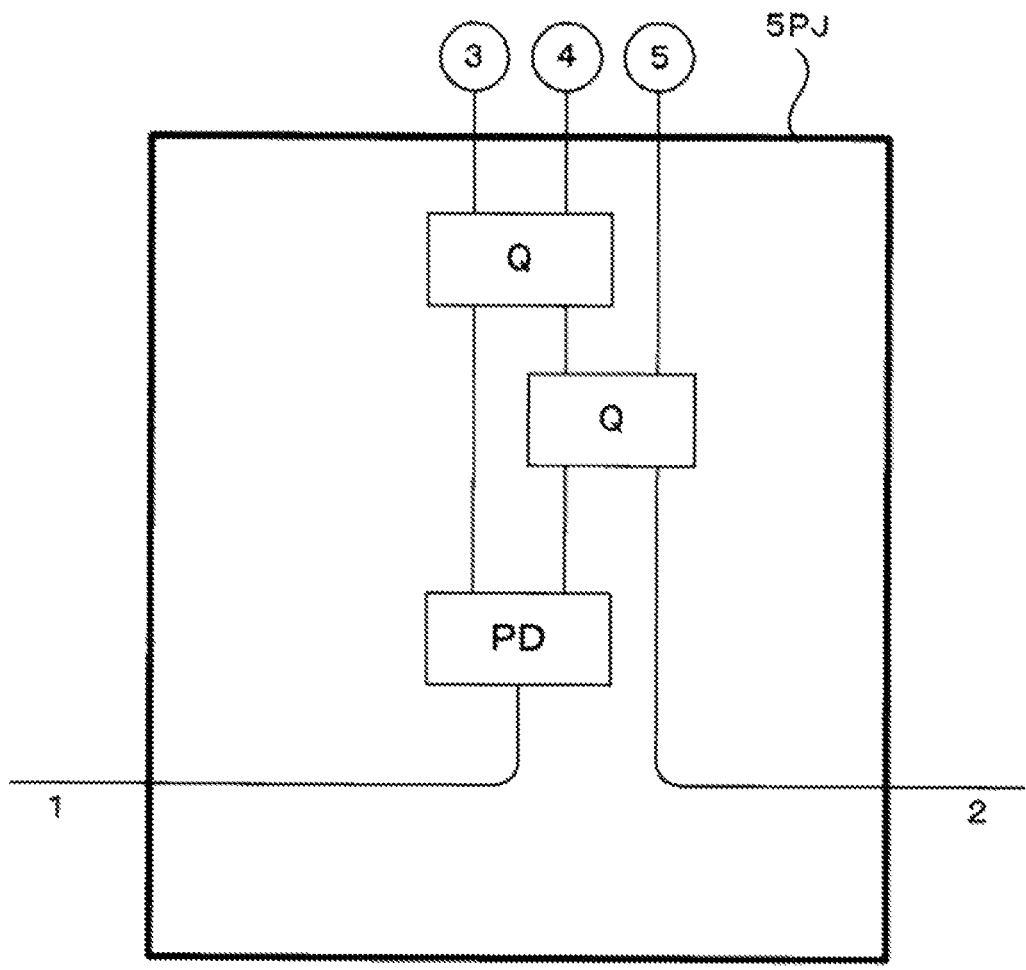
FIG. 1 is an internal block diagram of a 5-port junction.

An example of a 5-port junction is shown in FIG. 1. In the drawing, 5PJ represents the 5-port junction. Q is a known 90° hybrid, and PD is a known power divider. Port 1 and port are input ports. Reference numerals 3 to 5 indicate ports for power measurement. The 90° hybrid is a device for, if a high frequency signal is input to one port on one side, outputting a high frequency signal for half the amplitude of the input signal to an opposite port on the opposite side, and outputting the remaining half to another port on the opposite side, giving a phase difference of 90° between the opposite port and the other port.

Operation of the 5-port junction 5PJ is as follows.

A five-port correlator is a linear circuit system for measuring a mutual relationship (in amplitude and phase) between sine waves respectively input to two ports from power values output from the remaining three ports.

Figure 2:
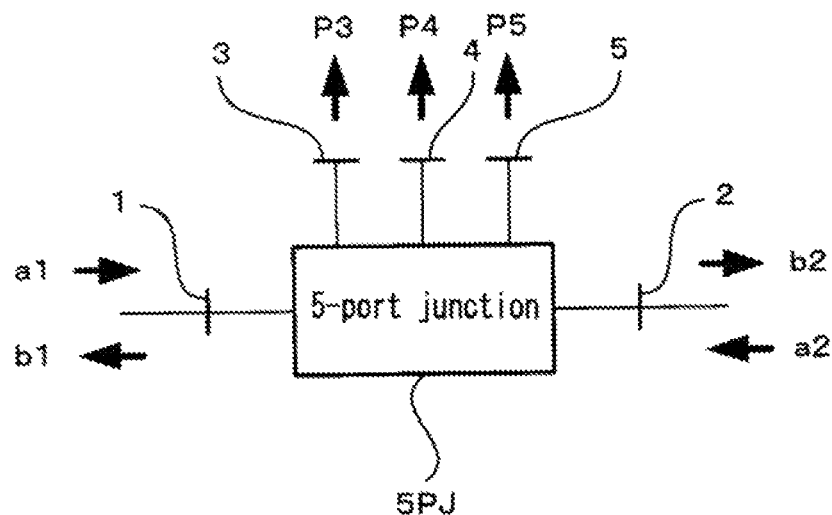
FIG. 2 is an explanatory diagram of the 5-port junction.

With the 5-port junction of FIG. 2, if the complex amplitudes of input waves from input ports 1 and 2 are made a1 and a2, power of waves appearing at side arm ports 3, 4 and 5 can be written as follows.

equation 5

$$P_h = \alpha_h |A_h a_2 + B_h a_1|^2 \quad (h=3,4,5) \quad (1)$$

Here, Ah and Bh are complex constants inherent to the 5-port junction, and αh is a conversion coefficient.

With the correlator, wave a1 input from port 1 is made a reference wave, and wave a2 input from port 2 is made a measurement wave, and a complex amplitude ratio W for the measurement wave with respect to the reference wave is measured.

Figure 3:
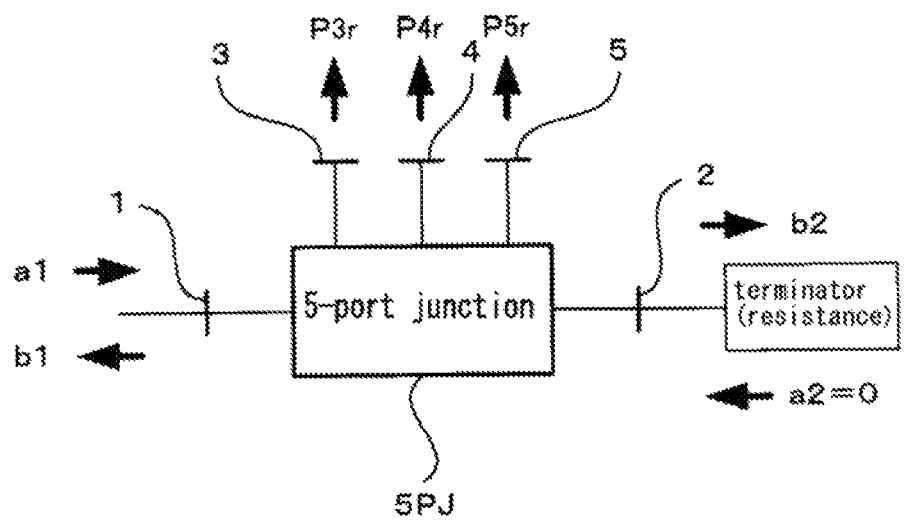
FIG. 3 is an explanatory diagram of the 5-port junction (port 2 has a matched termination).

Therefore, as shown in FIG. 3, with port 2 match terminated to let a2=0, side arm power for only the reference input wave is defined as reference port power Phr, and equation (1) can be rewritten as in the following.

equation 6

$$\overline{P_h} \equiv \frac{P_h}{P_{hr}} = |1 + k_h W|^2 \text{: Normalized port power} \quad (2)$$

$$W = \frac{a_2}{a_1} \text{: Input complex amplitude ratio} \quad (3)$$

$$k_h \equiv \frac{A_h}{B_h} \text{: System paramater} \quad (4)$$

$$P_{hr} \equiv P_h|_{a_2=0} = \alpha_h |B_h a_1|^2 \text{: Reference output port power} \quad (5)$$

kh in equation 4 described above is a conventional system parameter called parameter K in a reflectometer or parameter T in a correlator. In carrying out measurement using the correlator provided with the 5-port junction, a power value for a wave at each output port is measured, and calculation is carried out by substituting the power values and the system parameter into specified equations. The system parameter is a value inherent to the 5-port junction 5PJ. With this embodiment, parameter H is newly introduced as a system parameter. The system parameter (parameter H with this embodiment) must be obtained in advance before measurement, in accordance with the procedure described below. This point will be described in more detail later.

Figure 4:
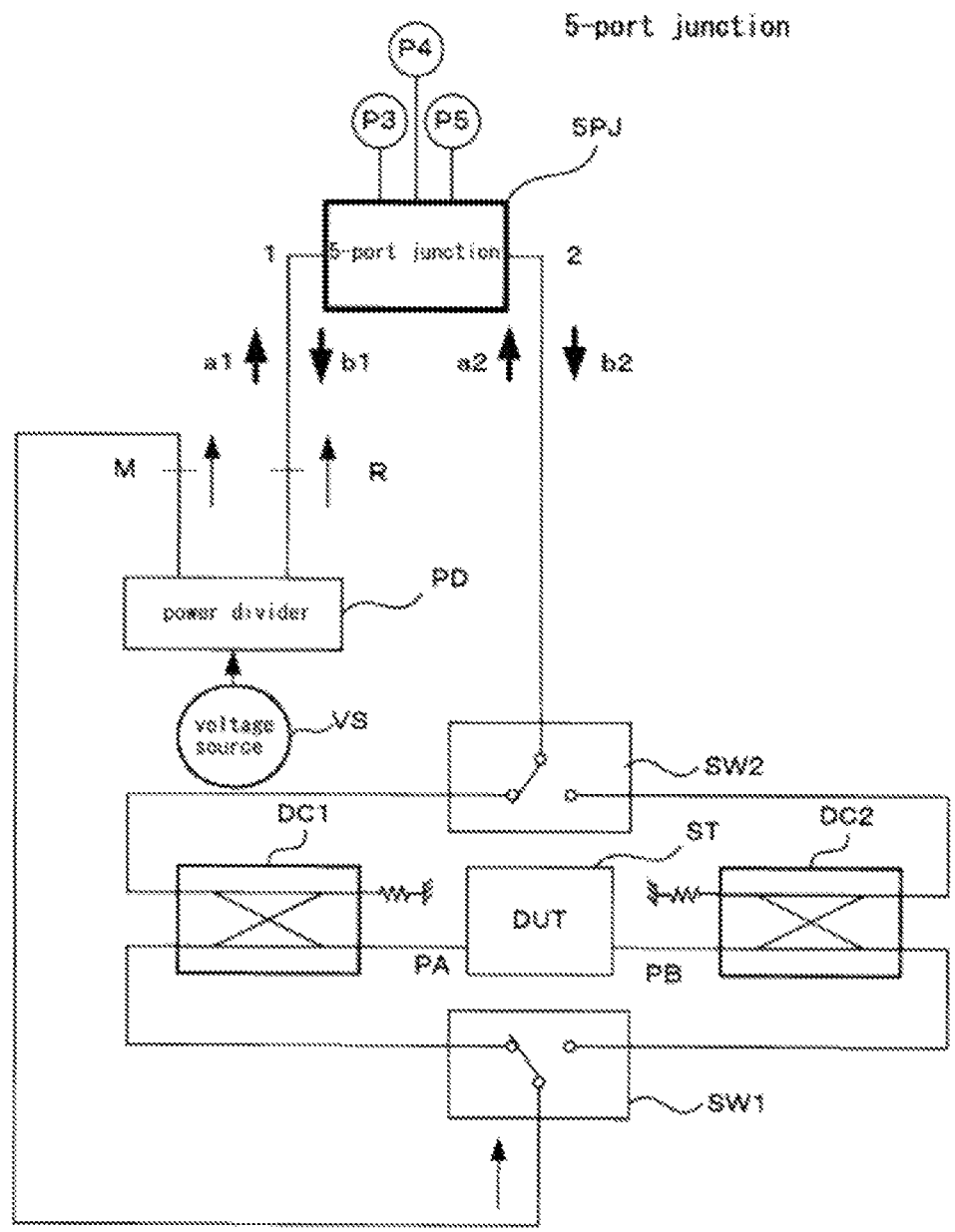
FIG. 4 is a block diagram of a measurement circuit (VNA) for a DUT.

An example of a measurement circuit for a DUT is shown in FIG. 4. In measurement of the DUT, first the system parameter of the circuit is obtained, and then S-parameters of the DUT are obtained using this system parameter.

In FIG. 4, VS is a voltage source (signal source) for supplying a signal of a specified frequency. PD is a power divider for dividing a wave from the power supply VS into two. The power divider PD in FIG. 4 is separate from the power divider PD in FIG. 1. Although not shown in the drawings, the unit of FIG. 4 may also be provided with a detector for measuring power of the output ports, an amplifier for amplifying outputs of the detector, and a personal computer for receiving outputs from the amplifier, and calculating the system parameter based on these outputs (specifically detection outputs of the three output ports P3 to P4 of the 5-port Junction 5PJ).

DC1 and DC2 are directional couplers. Two ends at one side of the directional coupler DC1 are connected to a first switch SW1 and a second switch SW2, one end at the other side is connected to one end of a two port device under test (hereafter referred to as "DUT"), and the remaining end is terminated. The same applies to the directional coupler DC2. SW1 is a switch for inputting a wave from the power divider PD to one of the two directional couplers DC1 and DC2. SW2 is a switch for selecting one of the two directional couplers DC1 and DC2, and sending a wave from the selected coupler to port 2 of the 5-port junction 5PJ.

The first switch SW1 and the second switch SW2 constitute the switching mechanism for realizing connections for respectively measuring four S-parameters (S11, S12, S21 and S22) of the DUT.

In the following description, the first switch SW1, the second switch SW2 etc. will be simply abbreviated to SW1, SW2.

SW1 and SW2 of FIG. 4 constitute the switching mechanism. The switching mechanism is provided between the power divider PD and port P2 of the 5-port junction 5PJ, and selects one of a first connection where a wave divided by the power divider PD is input to one port of the device under test (DUT) and a wave output from this port is input to the input port P2, a second connection where a wave divided by the power divider PD is input to another port of the DUT and a wave output from the one port is input to the input port P2, a third connection where a wave divided by the power divider PD is input to the one port of the DUT and a wave output from the one port is input to the input port P2, and a fourth connection where a wave divided by the power divider PD is input to the other port of the DUT and a wave output from this port is input to the input port P2.

The flowcharts of FIG. 5 to FIG. 8 described in the following respectively correspond to the first connection to the fourth connection.

FIG. 5 to FIG. 8 are flowcharts of a measurement method for system parameters (parameter H in this embodiment) of a correlator using the 5-port junction 5PJ. The system parameters H3_11 . . . will be described in detail later. The terms "load", "short", "line 1", "line 2" etc. in the following description are standards, and their characteristics already known.

Figure 5:
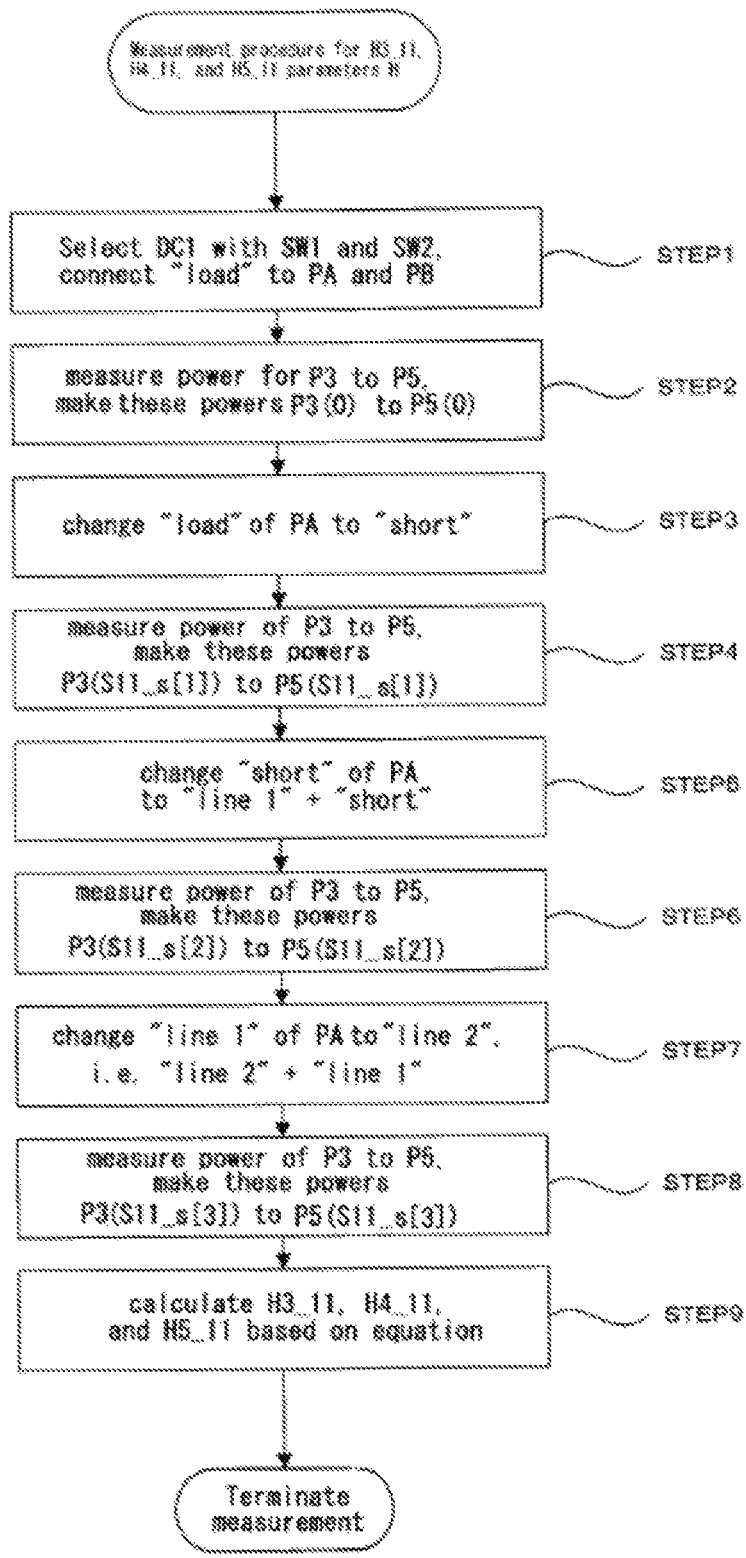
FIG. 5 is a flowchart showing measurement procedure for H3_11, H4_11, and H5_11.

(1) Measurement Procedure for H3_11, H4_11, H5_11 (Referred to FIG. 5).

Figure 9:
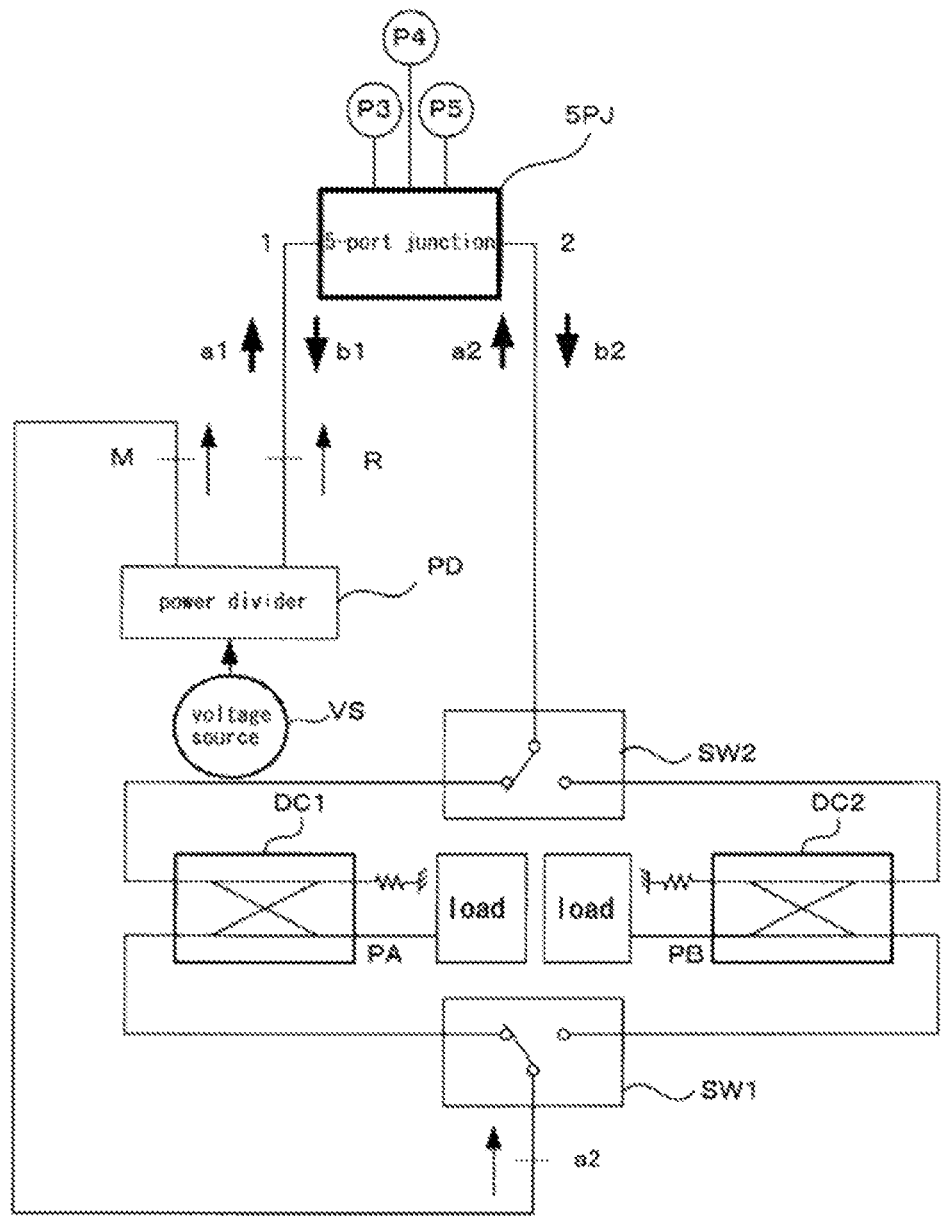
FIG. 9 is a drawing showing circuit connection for H3_11, H4_11, and H5_11 measurement ("load" connection).

STEP1: SW1 is set to the left side, and SW2 is set to the left side (DC1 is selected). Then "load" is connected to PA (matched termination), and "load" is connected to PB (refer to FIG. 9).

STEP2: Power values are acquired from P3, P4 and P5 of the 5-port junction PJ. These power values are made P3(0), P4(0), P5(0).

STEP3: The "load" of PA is changed to "short" (short-circuit). The "load" of PB is not changed.

STEP4: Power values are acquired from P3, P4 and P5 of the 5-port junction PJ. These power values are made P3 (S11_s[1]), P4 (S11_s[1]), P5 (S11_s[1]).

Figure 10:
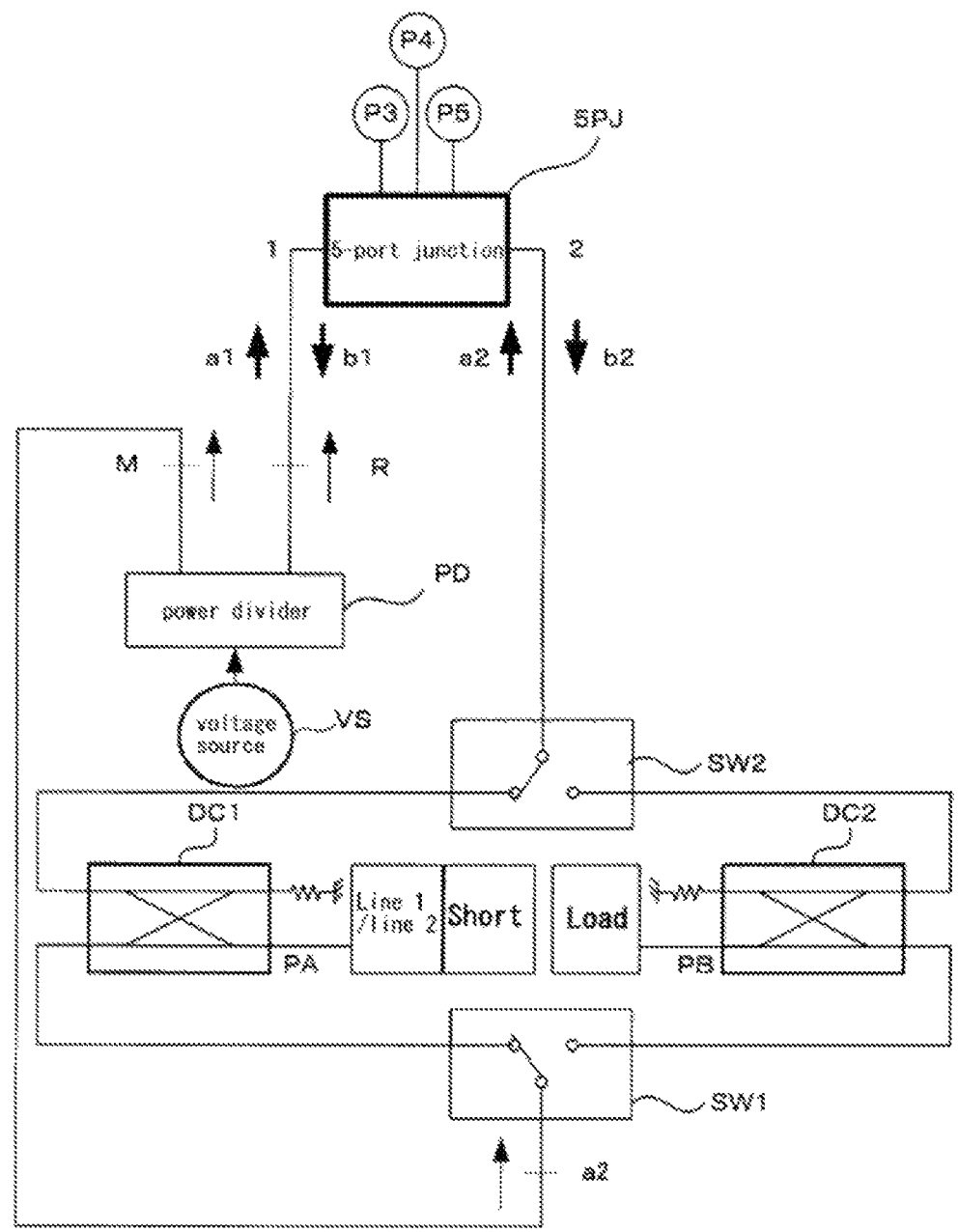
FIG. 10 is a drawing showing circuit connection for H3_11, H4_11, and H5_11 measurement ("line 1/2"+"load" connection).

STEP5: The "short" of PA is changed to "line 1 (adapter or equivalent)"+"short" (refer to FIG. 10). The "load" of PB is not changed.

STEP6: Power values are acquired from P3, P4 and P5 of the 5-port junction PJ. These power values are made P3 (S11_s[2]), P4 (S11_s[2]), P5 (S11_s[2]).

STEP7: The "line 1 (adapter or equivalent)"+"short" of PA is changed to "line 2 (adapter or equivalent of a different length to line 1)"+"short".

STEP8: Power values are acquired from P3, P4 and P5 of the 5-port junction PJ. These power values are made P3 (S11_s[3]), P4 (S11_s[3], P5 (S11_s[3]).

STEP9: P3(0), P4(0), and P5(0), P3 (S11_s[1]), P4 (S11_s[1]), and P5 (S11_s[1]), P3 (S11_s[2]), P4 (S11_s[2]), and P5 (S11_s[2]), and P3 (S11_s[3]), P4 (S11_s[3], P5 (S11_s[3]) obtained in the above described steps are substituted into the equation of FIG. 16, making it possible to obtain H3_11, H4_11, and H5_11.

Figures 15, 16:
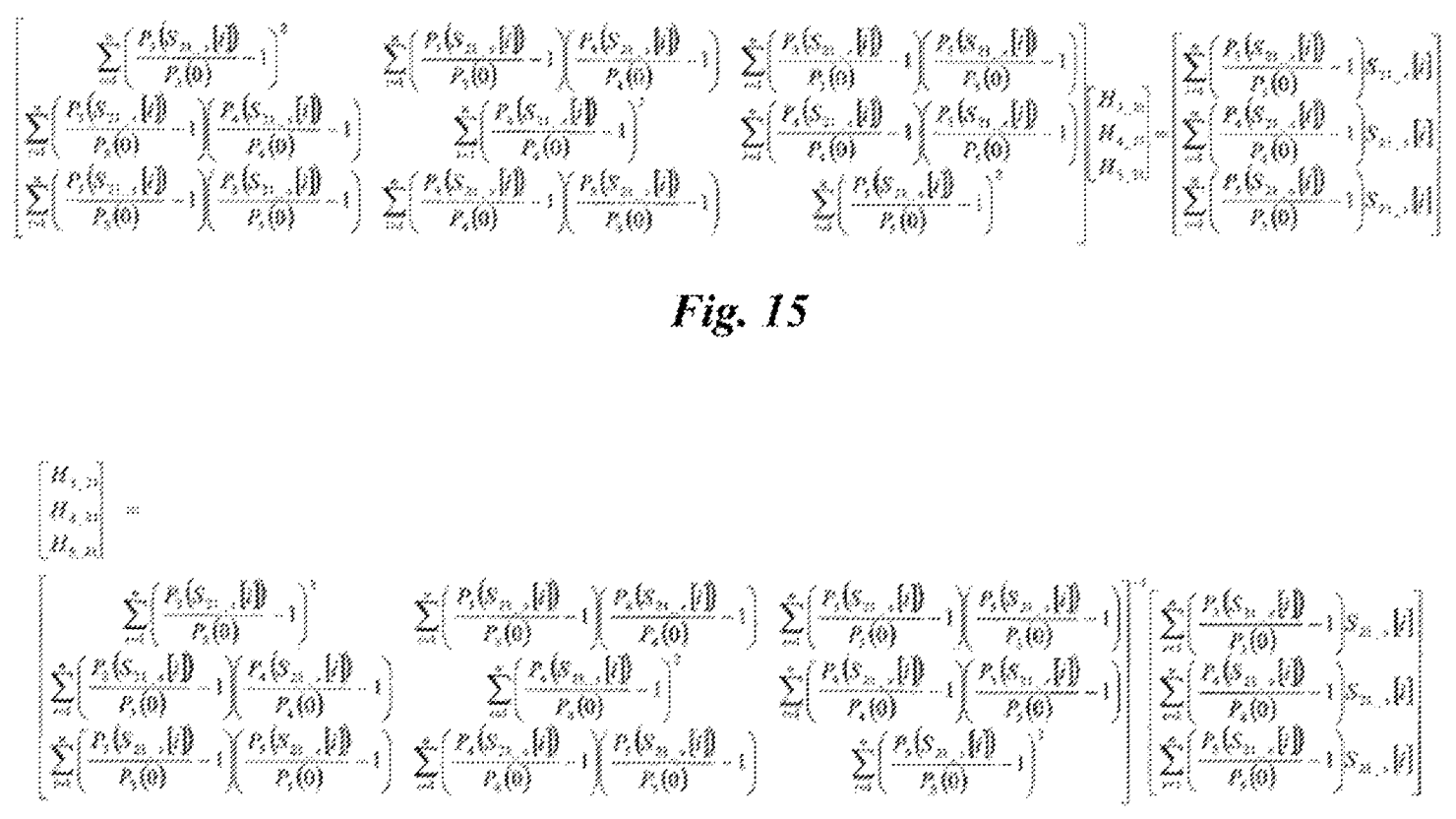

The right side of the equation of FIG. 16 is constituted by S21, but there is the same effect with S11, S12 and S22 also. S21_s[i] on the right side of FIG. 16 is rewritten to S11_s[i], and the above described values substituted (the same applies in the following). Parameters obtained in this way are H3_11, H4_11, and H5_11.

Figure 6:
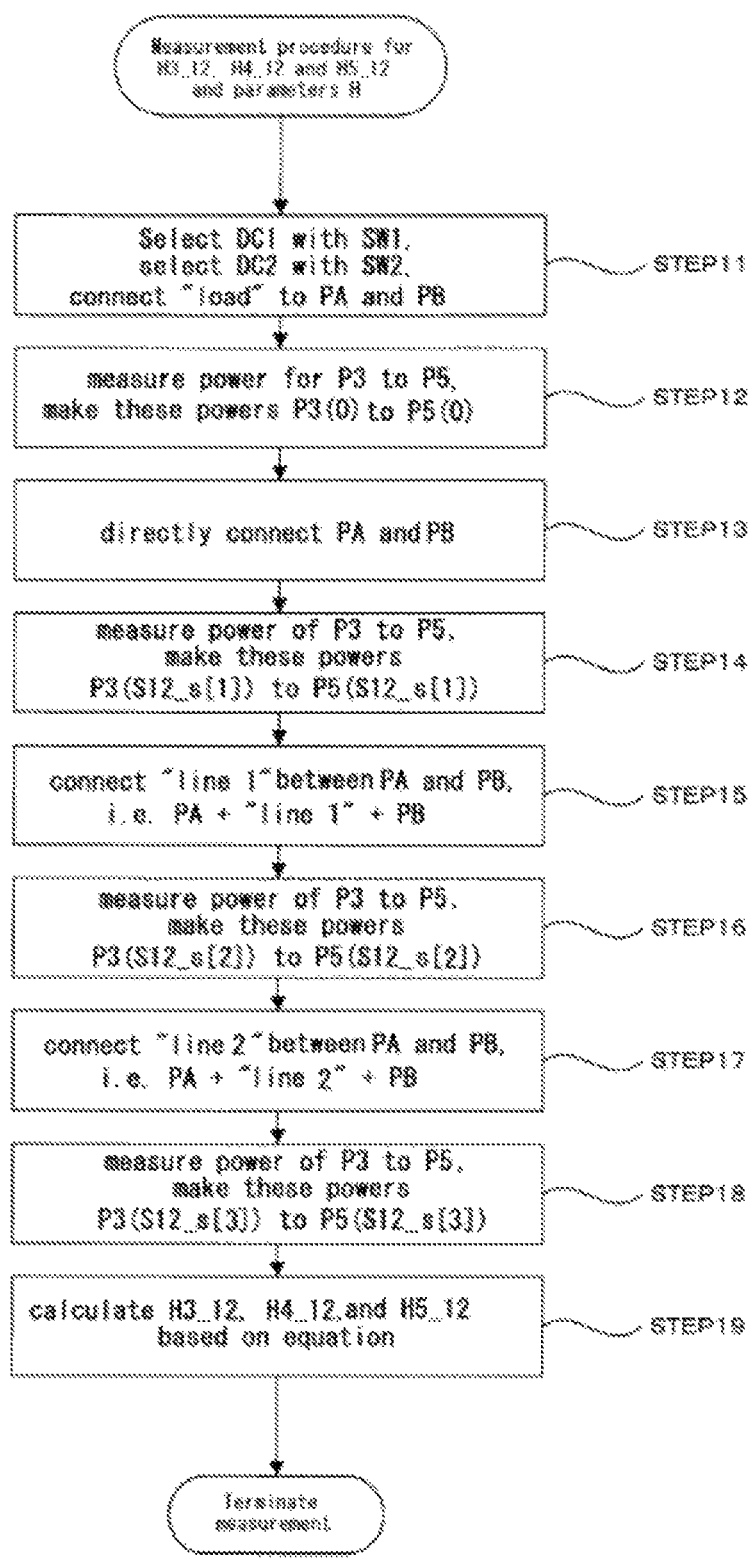
FIG. 6 is a flowchart showing the measurement procedure for H3_12, H4_12, and H5_12.

(2) Measurement Procedure for H3_12, H4_12, H5_12 (Referred to FIG. 6).

STEP11: SW1 is set to the right side (DC2 is selected), and SW2 is set to the left side (DC1 is selected). Then "load" is connected to PA (matched termination), and "load" is connected to PB.

STEP12: Power values are acquired from P3, P4 and P5 of the 5-port junction PJ. These power values are made P3(0), P4(0), P5(0).

Figure 12:
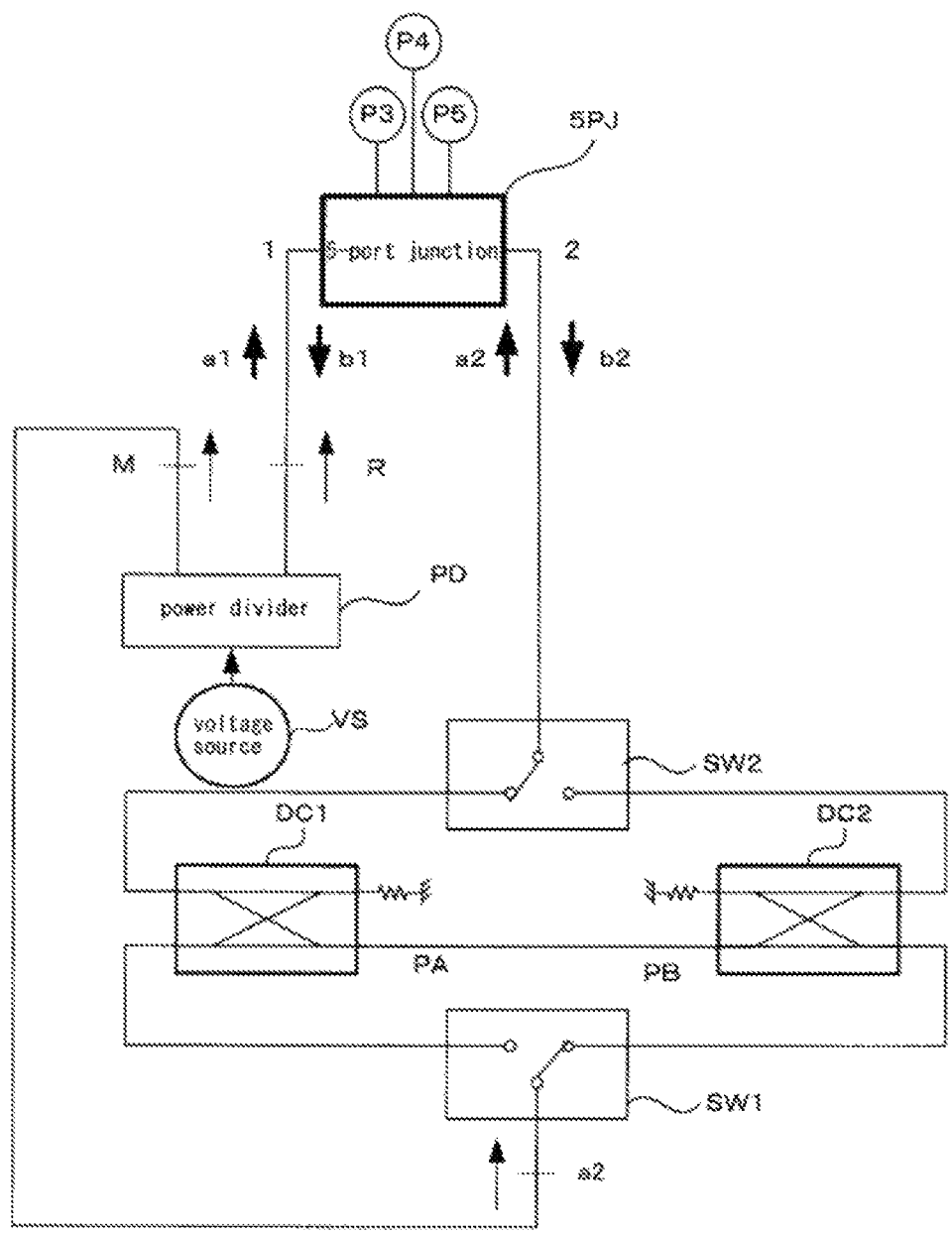
FIG. 12 is a drawing showing circuit connection for H3_12, H4_12, and H5_12 measurement (direct coupled).

STEP13: PA and PB are coupled (refer to FIG. 12)

STEP14: Power values are acquired from P3, P4 and P5 of the 5-port junction 5PJ. These power values are made P3 (S12_s[1]), P4 (S12_s[1]), P5 (S12_s[1]).

Figure 11:
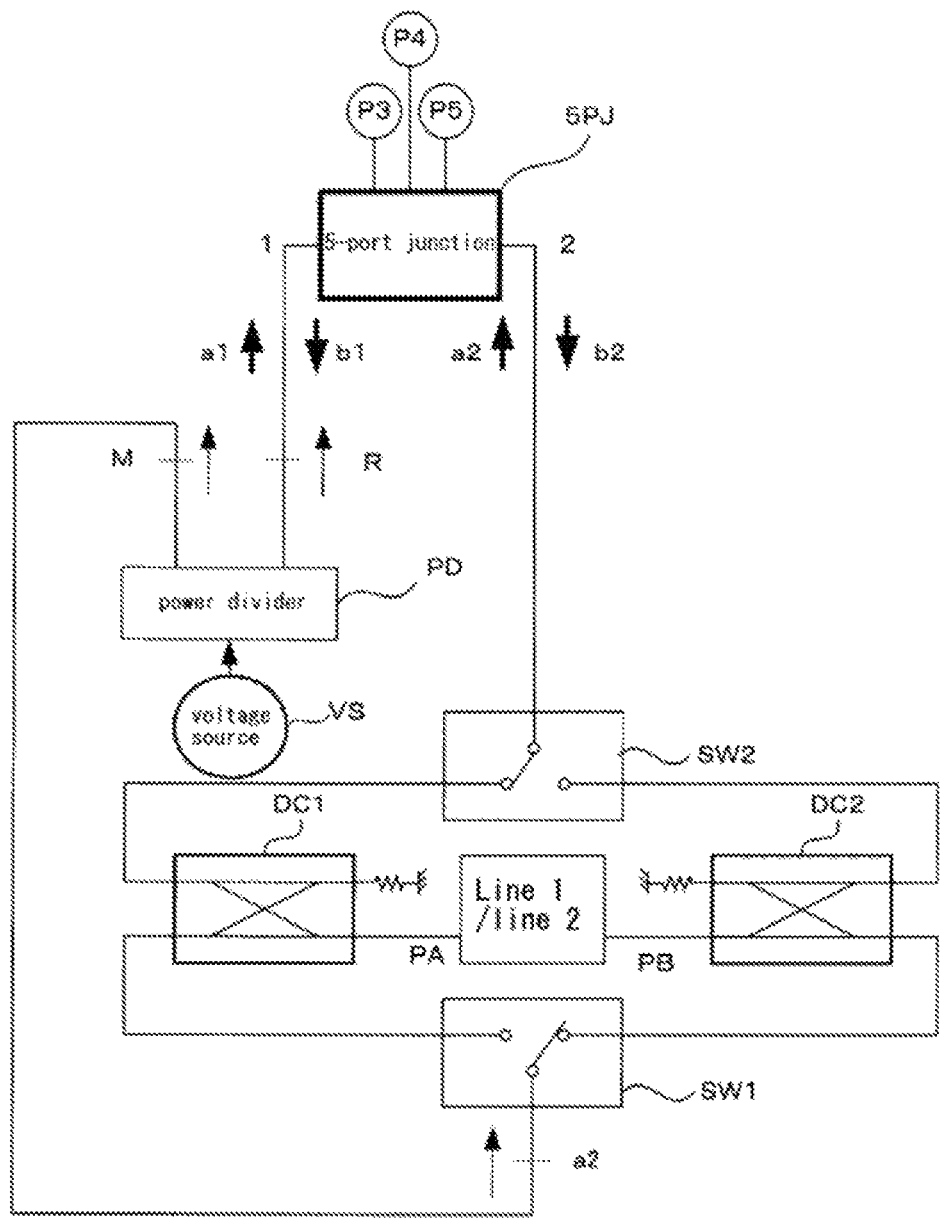
FIG. 11 is a drawing showing circuit connection for H3_12, H4_12, and H5_12 measurement ("line 1/2" connection).

STEP15: "line 1" is connected between PA and PB (refer to FIG. 11).

STEP16: Power values are acquired from P3, P4 and P5 of the 5-port junction 5PJ. These power values are made P3 (S12_s[2]), P4 (S12_s[2]), P5 (S12_s[2]).

STEP17: "line 1" between PA and PB is changed to "line 2" (refer to FIG. 11).

STEP18: Power values are acquired from P3, P4 and P5 of the 5-port junction 5PJ. These power values are made P3 (S12_s[3]), P4 (S12_s[3], P5 (S12_s[3]).

STEP19: P3(0), P4(0), and P5(0), P3 (S12_s[1]), P4 (S12_s[1]), and P5 (S12_s[1]), P3 (S12_s[2]), P4 (S12_s[2]), and P5 (S12_s[2]), and P3 (S12_s[3]), P4 (S12_s[3]), P5 (S12_s[3]) obtained in the above described steps are substituted into the equation of FIG. 16, making it possible to obtain H3_12, H4_12, and H5_12.

S21_s[i] on the right side of the equation of FIG. 16 is rewritten to S12_s[i], and the above described values are substituted in.

Figure 7:
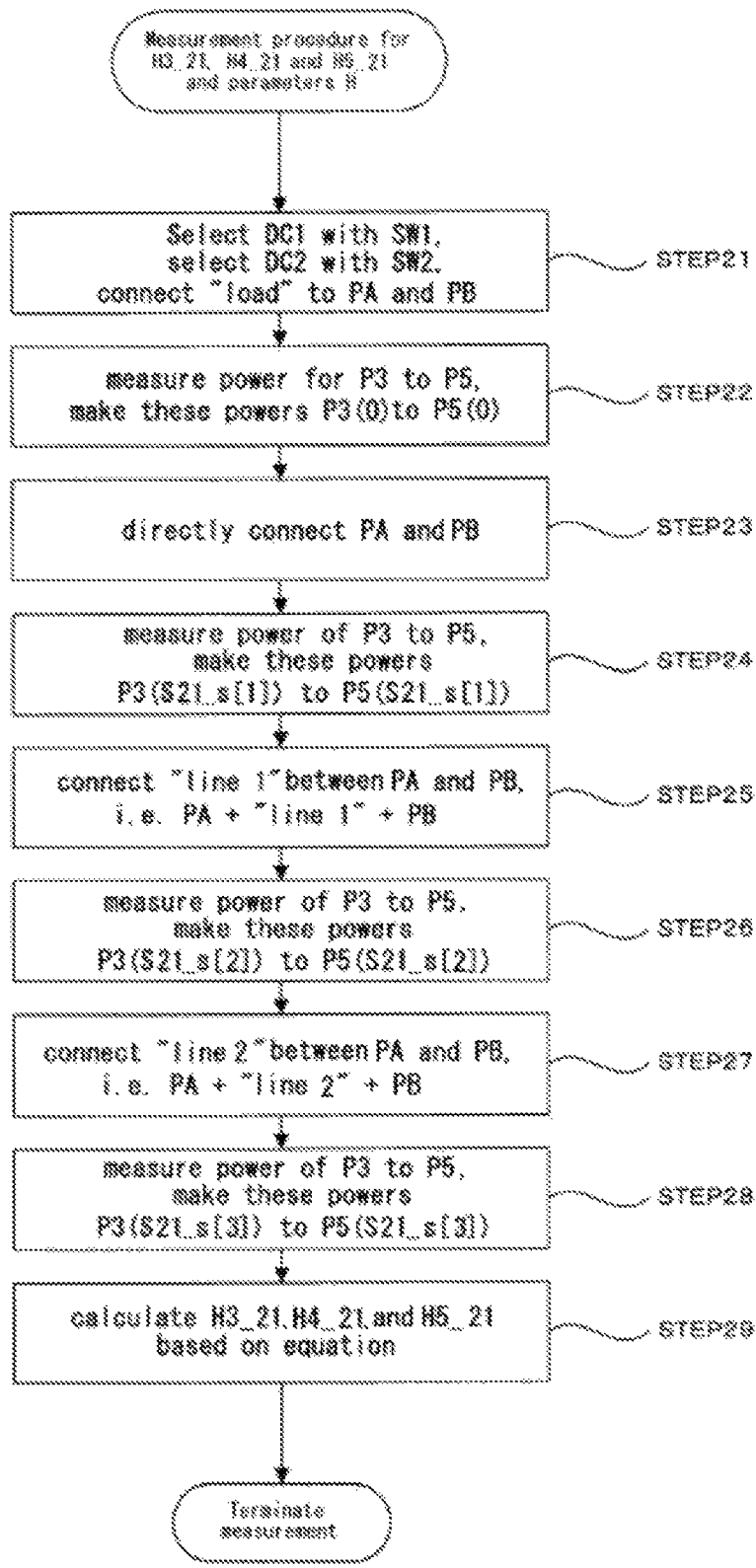
FIG. 7 is a flowchart showing the measurement procedure for H3_21, H4_21, and H5_21.

(3) Measurement Procedure for H3_21, H4_21, H5_21 (Referred to FIG. 7).

STEP21: SW1 is set to the left side (DC1 is selected), and SW2 is set to the right side (DC2 is selected). Then "load" is connected to PA (matched termination), and "load" is connected to PB.

STEP22: Power values are acquired from P3, P4 and P5 of the 5-port junction 5PJ. These power values are made P3(0), P4(0), P5(0).

STEP23: PA and PB are coupled directly.

STEP24: Power values are acquired from P3, P4 and P5 of the 5-port junction 5PJ. These power values are made P3 (S21_s[1]), P4 (S21_s[1]), P5 (S21_s[1]).

STEP25: "line 1" is connected between PA and PB.

STEP26: Power values are acquired from P3, P4 and P5 of the 5-port junction 5PJ. These power values are made P3 (S21_s[2]), P4 (S21_s[2]), P5 (S21_s[2]).

STEP27: "line 1" between PA and PB is changed to "line 2".

STEP28: Power values are acquired from P3, P4 and P5 of the 5-port junction 5PJ. These power values are made (S21_s [3]), P4 (S21_s[3], P5 (S21_s[3]).

STEP29: P3(0), P4(0), and P5(0), P3 (S21_s[1]), P4 (S21_s[1]), and P5 (S21_s[1]), P3 (S21_s[2]), P4 (S21_s[2]), and P5 (S21_s[2]), and P3 (S21_s[3]), P4 (S21_[3], P5 (S21_s[3]) obtained in the above described steps are substituted into the equation of FIG. 16, making it possible to obtain H3_21, H4_21, and H5_21.

Figure 8:
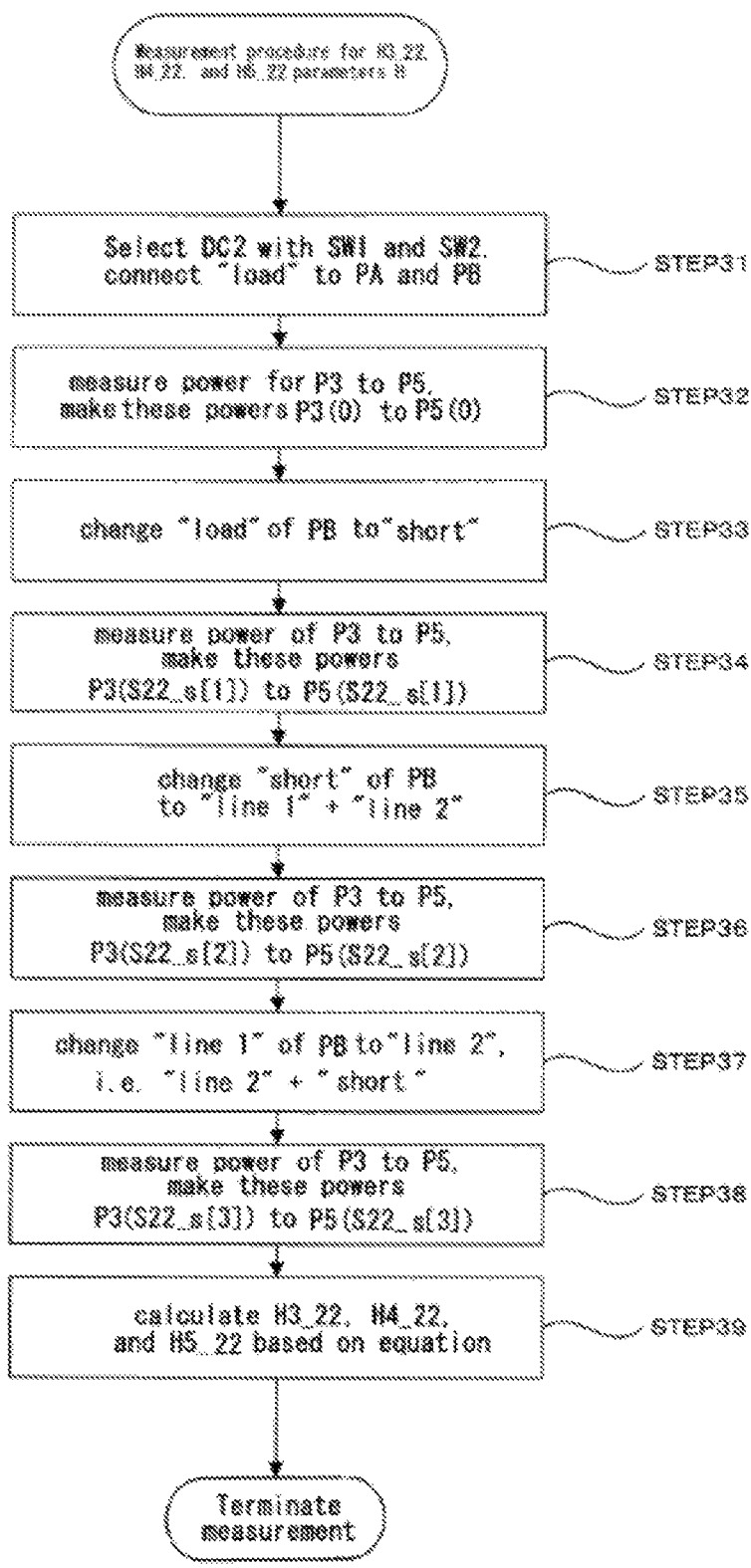
FIG. 8 is a flowchart showing measurement procedure for H3_22, H4_22, and H5_22.

(4) Measurement Procedure for H3_22, H4_22, H5_22 (Referred to FIG. 8).

STEP31: SW1 is set to the right side, and SW2 is set to the right side (DC2 is selected). Then "load" is connected to PA (matched termination), and "load" is connected to PB.

STEP32: Power values are acquired from P3, P4 and P5 of the 5-port junction 5PJ. These power values are made P3(0), P4(0), P5(0).

STEP33: The "load" of PB is changed to "short" (short-circuit). The "load" of PA is not changed.

STEP34: Power values are acquired from P3, P4 and P5 of the 5-port junction 5PJ. These power values are made P3 (S22_s[1]), P4 (S22_s[1]), P5 (S22_s[1]).

STEP35: The "short" of PB is changed to "line 1"+"short". The "load" of PA is not changed.

STEP36: Power values are acquired from P3, P4 and P5 of the 5-port junction 5PJ. These power values are made P3 (S22_s[2]), P4 (S22_s[2]), P5 (S22_s[2]).

STEP37: The "line 1"+"short" of PB is changed to "line 2"+"short".

STEP38: Power values are acquired from P3, P4 and P5 of the 5-port junction 5PJ. These power values are made P3 (S22_s[3]), P4 (S22_s[3], P5 (S22_s[3]).

STEP39: P3(0), P4(0), and P5(0), P3 (S22_s[1]), P4 (S22_s[1]), and P5 (S22_s[1]), P3 (S22_s[2]), P4 (S22_s[2]), and P5 (S22_s[2]), and P3 (S22_s[3]), P4 (S22_s[3], P5 (S22_s[3]) obtained in the above described steps are substituted into the equation of FIG. 16, making it possible to obtain H3_22, H4_22, and H5_22.

S21_s[i] on the right side of the equation of FIG. 16 is rewritten to S22_s[i], and the above described values are substituted in.

The "short", "load", "line 1" and "line 2" being used here are all of known characteristics.

The above described measurement method can also be similarly applied to a 5.1 port described in the following.

Figure 13:
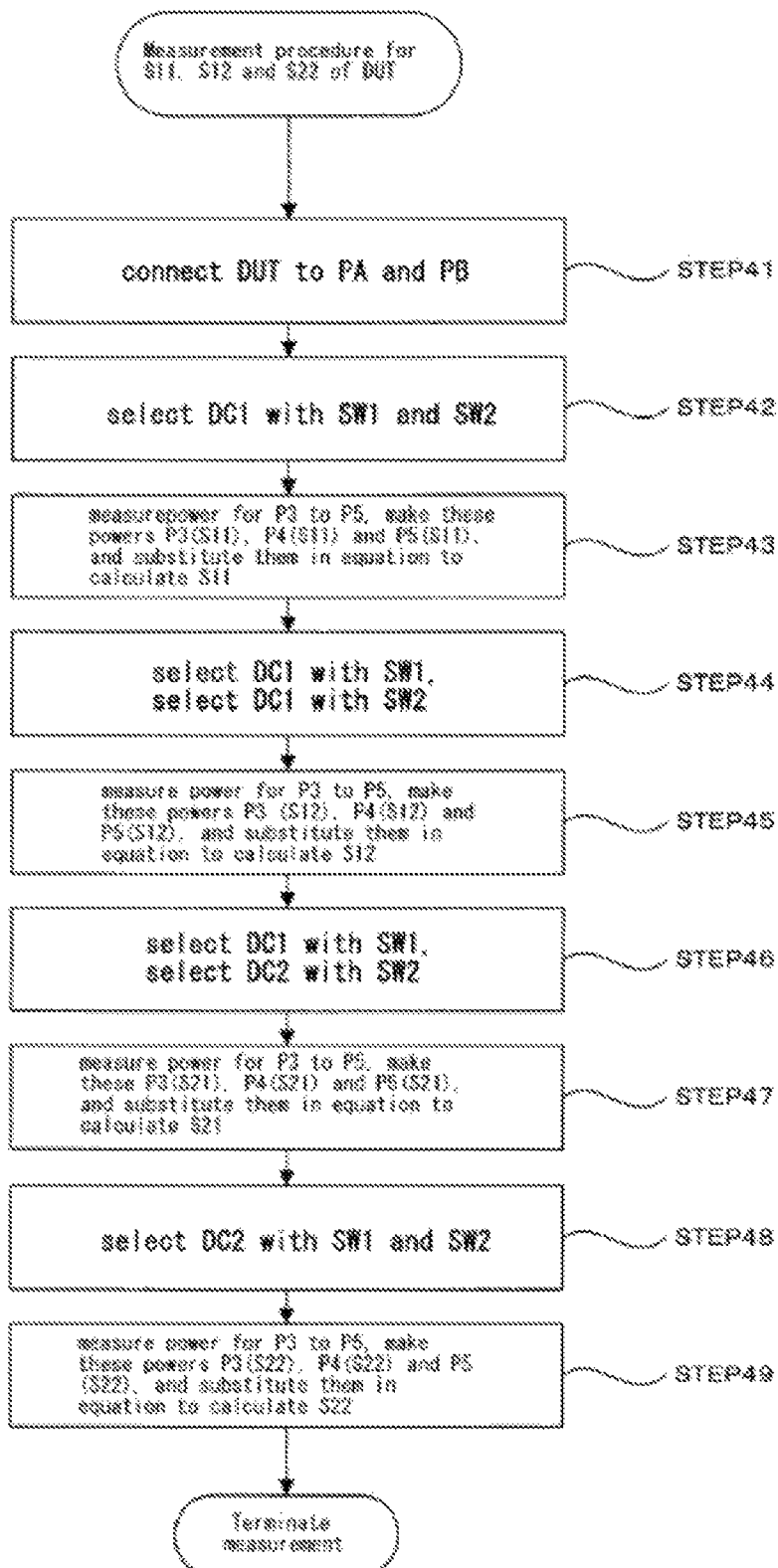
FIG. 13 is a flowchart showing the measurement procedure for S11, S12, S21, and S22 of the DUT.

FIG. 13 is a flowchart of a measurement method for S-parameters of a DUT using the 5-port junction 5PJ. Equations used in FIG. 13 are as follows.

Expression 7

$$S_{11} = H_{3\_11}\left(\frac{P_3(S_{11})}{P_3(0)} - 1\right) + H_{4\_11}\left(\frac{P_4(S_{11})}{P_4(0)} - 1\right) + H_{5\_11}\left(\frac{P_5(S_{11})}{P_5(0)} - 1\right)$$

$$S_{12} = H_{3\_12}\left(\frac{P_3(S_{12})}{P_3(0)} - 1\right) + H_{4\_12}\left(\frac{P_4(S_{12})}{P_4(0)} - 1\right) + H_{5\_12}\left(\frac{P_5(S_{12})}{P_5(0)} - 1\right)$$

$$S_{21} = H_{3\_21}\left(\frac{P_3(S_{21})}{P_3(0)} - 1\right) + H_{4\_21}\left(\frac{P_4(S_{21})}{P_4(0)} - 1\right) + H_{5\_21}\left(\frac{P_5(S_{21})}{P_5(0)} - 1\right)$$

$$S_{22} = H_{3\_22}\left(\frac{P_3(S_{22})}{P_3(0)} - 1\right) + H_{4\_22}\left(\frac{P_4(S_{22})}{P_4(0)} - 1\right) + H_{5\_22}\left(\frac{P_5(S_{22})}{P_5(0)} - 1\right)$$

The measurement procedure will be described with reference to FIG. 13.

STEP41: A DUT is connected as shown in FIG. 4 (PA+DUT+PB).

STEP42: DC1 is selected by SW1 and SW2 (setting SW1 is set to the left side, and SW2 to the left side).

STEP43: Power values are acquired from P3, P4 and P5 of the 5-port junction. These are made P3 (S11), P4 (S11) and P5 (S11). These values as well as already obtained P3(0), P4(0) and P5(0) (refer to FIG. 5 and its description), and H3_11, H4_11, and H5_11 are substituted into the above described equation for S11 to obtain S11.

STEP44: DC2 is selected by SW1, and DC1 is selected by SW2.

STEP45: Power values are acquired from P3, P4 and P5 of the 5-port junction. These are made P3 (S12), P4 (S12) and P5 (S12). These values as well as already obtained P3(0), P4(0) and P5(0) (refer to FIG. 6 and its description), and H3_12, H4_12, and H5_12 are substituted into the above described equation for S12 to obtain S12.

STEP46: DC1 is selected by SW1, and DC2 is selected by SW2.

STEP47: Power values are acquired from P3, P4 and P5 of the 5-port junction. These are made P3 (S21), P4 (S21) and P5 (S21). These values as well as already obtained P3(0), P4(0) and P5(0) (refer to FIG. 7 and its description), and H3_21, H4_21, and H5_21 are substituted into the above described equation for S21 to obtain S21.

STEP48: DC2 is selected by SW1 and SW2.

STEP49: Power values are acquired from P3, P4 and P5 of the 5-port junction. These are made P3 (S22), P4 (S22) and P5 (S22). These values as well as already obtained P3(0), P4(0) and P5(0) (refer to FIG. 8 and its description), and H3_22, H4_22) and H5_22 are substituted into the above described equation for S22 to obtain S22.

With the previously conventional homodyne method, three circular cross points were calculated in order to obtain system parameters (parameter T or parameter K). Accordingly, as previously described, there are problems that calculation for obtaining circular cross points is complicated, and it is difficult to accurately obtain cross points.

What has been newly discovered by the present inventors is that for 5 ports, S-parameters can be expressed by a linear coupling using the new parameter H and power difference ratios ({P(S)/P(0)}−1). Using this knowledge, it becomes possible to directly calculate the parameter H. According to the embodiments of the present invention, it is possible to easily calculate parameter H using a minimum of three already known standards, and amount of calculation can be reduced.

In the following a description will be given for derivation of the equations.

A. Way of Obtaining System Parameters of 5 Ports System Using a Least-Square Method First, the basic formula for a 5-port system will be described.

If an input wave from port 1 is made a1 and an input wave from port 2 is made a2, power of an output port i is represented by the following equation with Ai, Bi as complex constants:

$$P_i = \alpha |A_i a_1 + B_i a_2|^2 = \alpha |A_i a_1|^2 \left| 1 + \frac{B_i a_2}{A_i a_1} \right|^2 \quad \text{Equation 8}$$

Here, Bi/Ai=ki, a2/a1=W and Pi are functions of W, and so if Pi≡Pi(W), $$P_i(W) = \alpha |A_i a_1|^2 |1 + k_i W|^2 \quad \text{Equation 9}$$

results. Also, since Pi(0)=α|Aia1|^2|1+ki0|^2=|Aia1|^2 the above described equation (equation 9) can be rewritten to $$P_i(W) = P_i(0)|1 + k_i W|^2 \quad \text{Equation 10}$$

In the case of a 5-port VNA, if the transmission coefficient of the DUT is made S21, then the following equation can be obtained.

$$P_i(S_{21}) = P_i(0)|1 + k_i S_{21}|^2 \quad \text{Equation 11}$$

If an equation to obtain S21 is derived by applying the above equation (equation 11) to port i (i=3, 4, 5) and rearranging, H3_21, H4_21, and H5_21 are made system constants to give $$S_{21} = H_{3\_21} \left( \frac{P_3(S_{21})}{P_3(0)} - 1 \right) + H_{4\_21} \left( \frac{P_4(S_{21})}{P_4(0)} - 1 \right) + H_{5\_21} \left( \frac{P_5(S_{21})}{P_5(0)} - 1 \right) \quad \text{Equation 12}$$

Similar equations are also established for S11, S12 and S22.

It is also possible to similarly obtain system parameters for S11, S12 and S22.

Method of Determining System Parameters Using Least-Square Method.

A number i (i=3, 4, 5 . . . ) of known standards are prepared, a square I of differences between equation (equation 12) (when respective standards are connected) and S21_s[i]

$$I = \left| H_{3\_21} \left( \frac{P_3(S_{21\_s}[i])}{P_3(0)} - 1 \right) + H_{4\_21} \left( \frac{P_4(S_{21\_s}[i])}{P_4(0)} - 1 \right) + H_{5\_21} \left( \frac{P_5(S_{21\_s}[i])}{P_5(0)} - 1 \right) - S_{21\_s}[i] \right|^2 \quad \text{Equation 13}$$

is obtained, and if an equation in which a partial differential of the obtained result is made zero, the following equation will be obtained.

$$\frac{\partial I}{\partial H_{3\_21}} = 0, \frac{\partial I}{\partial H_{4\_21}} = 0, \frac{\partial I}{\partial H_{5\_21}} = 0 \quad \text{Equation 14}$$

If this is expressed as a matrix we get the equation shown in FIG. 15. As a result it is possible to obtain the equation shown in FIG. 16.

Substituting, for example, FIG. 7 measurement values P3(0), P4(0), and P5(0), P3 (S21_s[1]), P4 (S21_s[1]), and P5 (S21_s[1]), P3 (S21_s[12]), P4 (S21_s[2]), and P5 (S21_s [2]), and P3 (S21_s[3]), P4 (S21_s[3]), and P5 (S21_s[3]), into equation 12 described above gives simultaneous equation of three variables It is also possible to obtain the system parameters H3_21, H4_21, and H5_11 by solving this equation. That is, using the above described least-square method is not essential.

Derivation of Equations for 5-Port System

If an equation to obtain W is derived by applying the above 5-port system basic formula (equation 10) to port i (i=3, 4, 5), then from $$|k_3 W|^2 + k_3 W + k_3^* W^* = \frac{P_3(W)}{P_3(0)} - 1 \quad \text{Equation 15}$$

$$|k_4 W|^2 + k_4 W + k_4^* W^* = \frac{P_4(W)}{P_4(0)} - 1$$

$$|k_5 W|^2 + k_5 W + k_5^* W^* = \frac{P_5(W)}{P_5(0)} - 1 \quad \text{Equation 16}$$

expressing in matrix form as $$\begin{bmatrix} |k_3|^2 & k_3 & k_3^* \\ |k_4|^2 & k_4 & k_4^* \\ |k_5|^2 & k_5 & k_5^* \end{bmatrix} \begin{bmatrix} W^2 \\ W \\ W^* \end{bmatrix} = \begin{bmatrix} \frac{P_3(W)}{P_3(0)} - 1 \\ \frac{P_4(W)}{P_4(0)} - 1 \\ \frac{P_5(W)}{P_5(0)} - 1 \end{bmatrix} \quad \text{Equation 17}$$

results in $$W = \frac{\begin{vmatrix} |k_3|^2 & \frac{P_3(W)}{P_3(0)} - 1 & k_3^* \\ |k_4|^2 & \frac{P_4(W)}{P_4(0)} - 1 & k_4^* \\ |k_5|^2 & \frac{P_5(W)}{P_5(0)} - 1 & k_5^* \end{vmatrix}}{\begin{vmatrix} |k_3|^2 & k_3 & k_3^* \\ |k_4|^2 & k_4 & k_4^* \\ |k_5|^2 & k_5 & k_5^* \end{vmatrix}} \quad \text{Equation 18}$$

If equation 18 is then expanded, $$W = \frac{k_4^* k_5^* (k_5 - k_4)}{|k_3|^2 (k_4 k_5^* - k_4^* k_5) + |k_4|^2 (k_5 k_3^* - k_5^* k_3) + |k_5|^2 (k_3 k_4^* - k_3^* k_4)} \left( \frac{P_3(W)}{P_3(0)} - 1 \right) + \quad \text{Equation 19}$$

$$\frac{k_5^* k_3^* (k_3 - k_5)}{|k_3|^2 (k_4 k_5^* - k_4^* k_5) + |k_4|^2 (k_5 k_3^* - k_5^* k_3) + |k_5|^2 (k_3 k_4^* - k_3^* k_4)} \left( \frac{P_4(W)}{P_4(0)} - 1 \right) +$$

$$\frac{k_3^* k_4^* (k_4 - k_3)}{|k_3|^2 (k_4 k_5^* - k_4^* k_5) + |k_4|^2 (k_5 k_3^* - k_5^* k_3) + |k_5|^2 (k_3 k_4^* - k_3^* k_4)} \left( \frac{P_5(W)}{P_5(0)} - 1 \right)$$

and in equation 19

$$H_3 = \frac{k_4^* k_5^* (k_5 - k_4)}{|k_3|^2 (k_4 k_5^* - k_4^* k_5) + |k_4|^2 (k_5 k_3^* - k_5^* k_3) + |k_5|^2 (k_3 k_4^* - k_3^* k_4)} \quad \text{Equation 20}$$

-continued $$H_4 = \frac{k_5^* k_3^* (k_3 - k_5)}{|k_3|^2 (k_4 k_5^* - k_4^* k_5) + |k_4|^2 (k_5 k_3^* - k_5^* k_3) + |k_5|^2 (k_3 k_4^* - k_3^* k_4)}$$

$$H_5 = \frac{k_3^* k_4^* (k_4 - k_3)}{|k_3|^2 (k_4 k_5^* - k_4^* k_5) + |k_4|^2 (k_5 k_3^* - k_5^* k_3) + |k_5|^2 (k_3 k_4^* - k_3^* k_4)}$$

is placed, this becomes constant, and in this way equation 19 can be represented by a linear coupling thus:

$$W = H_3 \left( \frac{P_3(W)}{P_3(0)} - 1 \right) + H_4 \left( \frac{P_4(W)}{P_4(0)} - 1 \right) + H_5 \left( \frac{P_5(W)}{P_5(0)} - 1 \right) \quad \text{Equation 21}$$

In the case of a 5-port VNA, depending on a characteristic it is desired to measure, W in equation 19 described above is respectively rewritten to S11, S12, S21 S22, and can be respectively represented by $$S_{11} = H_{3\_11} \left( \frac{P_3(S_{11})}{P_3(0)} - 1 \right) + H_{4\_11} \left( \frac{P_4(S_{11})}{P_4(0)} - 1 \right) + H_{5\_11} \left( \frac{P_5(S_{11})}{P_5(0)} - 1 \right) \quad \text{Equation 22}$$

$$S_{12} = H_{3\_12} \left( \frac{P_3(S_{12})}{P_3(0)} - 1 \right) + H_{4\_12} \left( \frac{P_4(S_{12})}{P_4(0)} - 1 \right) + H_{5\_12} \left( \frac{P_5(S_{12})}{P_5(0)} - 1 \right)$$

$$S_{21} = H_{3\_21} \left( \frac{P_3(S_{21})}{P_3(0)} - 1 \right) + H_{4\_21} \left( \frac{P_4(S_{21})}{P_4(0)} - 1 \right) + H_{5\_21} \left( \frac{P_5(S_{21})}{P_5(0)} - 1 \right)$$

$$S_{22} = H_{3\_22} \left( \frac{P_3(S_{22})}{P_3(0)} - 1 \right) + H_{4\_22} \left( \frac{P_4(S_{22})}{P_4(0)} - 1 \right) + H_{5\_22} \left( \frac{P_5(S_{22})}{P_5(0)} - 1 \right)$$

The fact that W of equation 19 can be rewritten to S11, S12, S21, S22 is because they all exhibit an input/output relationship. Also from the above, it is shown, for example, that it is possible to derive equation 12.

Embodiment 2 of the Invention

In a 5-port junction, it has been shown that if it is possible to acquire parameter H it is possible to calculate S-parameters for the DUT using the power of ports 3, 4 and 5. The above described method is applicable not to a structure in which the number of physical ports is 5, but to a structure that functions as a five port junction.

Figure 14:
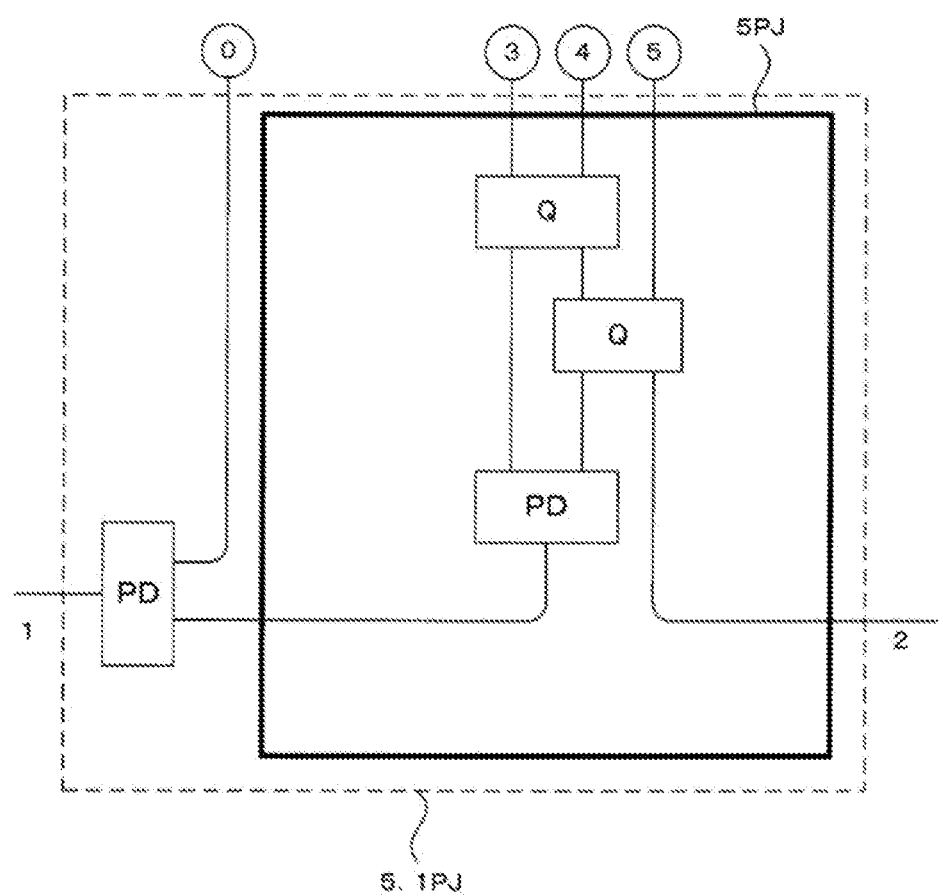
FIG. 14 is an internal block diagram of a 5.1 port junction.

As such an example, description will be given of a device with a single power divider PD added to a 5-port junction, as shown in FIG. 14. For the sake of convenience, the device in FIG. 14 describes a 5.1 port.

Derivation of Computational Expressions for 5.1 Port System

If an input wave from port 1 is made a1 and an input wave from port 2 is made a2, power of an output port i is represented by the following equation with Ai, Bi as complex constants:

$$P_i = \alpha |A_i a_1 + B_i a_2|^2 \quad \text{Equation 23}$$

Here, a ports being the output port that does not depend on a2, namely port where a2=0 (port O in FIG. 14)

$$P_h = \alpha |A_h a_1 + B_h a_2|^2 = \alpha |A_h a_1 + B_h(0)|^2 = \alpha |A_h a_1|^2 \quad \text{Equation 24}$$

is prepared, and if a ratio with this port is calculated $$\frac{P_i}{P_h} = \frac{\alpha |A_i a_1 + B_i a_2|^2}{\alpha |A_h a_1|^2} = \left| \frac{A_i a_1 + B_i a_2}{A_h a_1} \right|^2 = \left| \frac{A_i}{A_h} \right|^2 \left| 1 + \frac{B_i a_2}{A_h a_1} \right|^2 \quad \text{Equation 25}$$

Here, Pi/Ph=hPi, Ai/Ah=hAi, Bi/Ah=hki, a2/a1=W and hPi are functions of W, and so if hPi=hPi(W), $$_h P_i(W) = |_h A_i|^2 |1 + _h k_i W|^2 \quad \text{Equation 26}$$

results. Also, since hPi(0)=|hAi|^2|1+hki(0)|^2=|hAi|^2, equation 26 can be rewritten as $$_h P_i(W) = _h P_i(0) |1 + _h k_i W|^2 \quad \text{Equation 27}$$

If equation 26 described above is applied in ports h=0, i=3, 4, 5, and an equation to obtain W derived, then from $$|_0 k_3 W|^2 + _0 k_3 W + _0 k_3^* W^* = \frac{_0 P_3(W)}{_0 P_3(0)} - 1 \quad \text{Equation 28}$$

$$|_0 k_4 W|^2 + _0 k_4 W + _0 k_4^* W^* = \frac{_0 P_4(W)}{_0 P_4(0)} - 1$$

$$|_0 k_5 W|^2 + _0 k_5 W + _0 k_5^* W^* = \frac{_0 P_5(W)}{_0 P_5(0)} - 1$$

This can be expressed as a matrix, $$\begin{bmatrix} |_0 k_3|^2 & _0 k_3 & _0 k_3^* \\ |_0 k_4|^2 & _0 k_4 & _0 k_4^* \\ |_0 k_5|^2 & _0 k_5 & _0 k_5^* \end{bmatrix} \begin{bmatrix} W^2 \\ W \\ W^* \end{bmatrix} = \begin{bmatrix} \frac{_0 P_3(W)}{_0 P_3(0)} - 1 \\ \frac{_0 P_4(W)}{_0 P_4(0)} - 1 \\ \frac{_0 P_5(W)}{_0 P_5(0)} - 1 \end{bmatrix} \quad \text{Equation 29}$$

results in $$W = \frac{\begin{vmatrix} |_0 k_3|^2 & \frac{_0 P_3(W)}{_0 P_3(0)} - 1 & _0 k_3^* \\ |_0 k_4|^2 & \frac{_0 P_4(W)}{_0 P_4(0)} - 1 & _0 k_4^* \\ |_0 k_5|^2 & \frac{_0 P_5(W)}{_0 P_5(0)} - 1 & _0 k_5^* \end{vmatrix}}{\begin{vmatrix} |_0 k_3|^2 & _0 k_3 & _0 k_3^* \\ |_0 k_4|^2 & _0 k_4 & _0 k_4^* \\ |_0 k_5|^2 & _0 k_5 & _0 k_5^* \end{vmatrix}} \quad \text{Equation 30}$$

If equation 30 is expanded, $$W = \frac{_0 k_4^* _0 k_5^* (_0 k_5 - _0 k_4)}{|_0 k_3|^2 (_0 k_4 _0 k_5^* - _0 k_4^* _0 k_5) + |_0 k_4|^2 (_0 k_5 _0 k_3^* - _0 k_5^* _0 k_3) + |_0 k_5|^2 (_0 k_3 _0 k_4^* - _0 k_3^* _0 k_4)} \left( \frac{_0 P_3(W)}{_0 P_3(0)} - 1 \right) + \quad \text{Equation 31}$$

$$\frac{_0 k_5^* _0 k_3^* (_0 k_3 - _0 k_5)}{|_0 k_3|^2 (_0 k_4 _0 k_5^* - _0 k_4^* _0 k_5) + |_0 k_4|^2 (_0 k_5 _0 k_3^* - _0 k_5^* _0 k_3) + |_0 k_5|^2 (_0 k_3 _0 k_4^* - _0 k_3^* _0 k_4)} \left( \frac{_0 P_4(W)}{_0 P_4(0)} - 1 \right) +$$

$$\frac{_0 k_3^* _0 k_4^* (_0 k_4 - _0 k_3)}{|_0 k_3|^2 (_0 k_4 _0 k_5^* - _0 k_4^* _0 k_5) + |_0 k_4|^2 (_0 k_5 _0 k_3^* - _0 k_5^* _0 k_3) + |_0 k_5|^2 (_0 k_3 _0 k_4^* - _0 k_3^* _0 k_4)} \left( \frac{_0 P_5(W)}{_0 P_5(0)} - 1 \right)$$

and in equation 31

$$_0H_3 = \frac{_0k_{40}^* k_5^*(_0k_5 - _0k_4)}{|_0k_3|^2(_0k_{40}k_5^* - _0k_{40}^*k_5) + |_0k_4|^2(_0k_{50}k_3^* - _0k_{50}^*k_3) + |_0k_5|^2(_0k_{30}k_4^* - _0k_{30}^*k_4)}$$

$$_0H_4 = \frac{_0k_{50}^* k_3^*(_0k_3 - _0k_5)}{|_0k_3|^2(_0k_{40}k_5^* - _0k_{40}^*k_5) + |_0k_4|^2(_0k_{50}k_3^* - _0k_{50}^*k_3) + |_0k_5|^2(_0k_{30}k_4^* - _0k_{30}^*k_4)}$$

$$_0H_5 = \frac{_0k_{30}^* k_4^*(_0k_4 - _0k_3)}{|_0k_3|^2(_0k_{40}k_5^* - _0k_{40}^*k_5) + |_0k_4|^2(_0k_{50}k_3^* - _0k_{50}^*k_3) + |_0k_5|^2(_0k_{30}k_4^* - _0k_{30}^*k_4)}$$

Equation 32 are placed. Since these become constant, the above described equation 31 can be expressed by $$W = {_0H_3}\left(\frac{_0P_3(W)}{_0P_3(0)} - 1\right) + {_0H_4}\left(\frac{_0P_4(W)}{_0P_4(0)} - 1\right) + {_0H_5}\left(\frac{_0P_5(W)}{_0P_5(0)} - 1\right)$$

Equation 33 which is represented by a linear coupling. In the case of a 5.1 port VNA, depending on the characteristic that is desired to measure, W in equation 33 is respectively rewritten to S11, S12, S21, S22, and can be respectively expressed by $$S_{11} = {_0H_{3\_11}}\left(\frac{_0P_3(S_{11})}{_0P_3(0)} - 1\right) + {_0H_{4\_11}}\left(\frac{_0P_4(S_{11})}{_0P_4(0)} - 1\right) + {_0H_{5\_11}}\left(\frac{_0P_5(S_{11})}{_0P_5(0)} - 1\right)$$

$$S_{12} = {_0H_{3\_12}}\left(\frac{_0P_3(S_{12})}{_0P_3(0)} - 1\right) + {_0H_{4\_12}}\left(\frac{_0P_4(S_{12})}{_0P_4(0)} - 1\right) + {_0H_{5\_12}}\left(\frac{_0P_5(S_{12})}{_0P_5(0)} - 1\right)$$

$$S_{21} = {_0H_{3\_21}}\left(\frac{_0P_3(S_{21})}{_0P_3(0)} - 1\right) + {_0H_{4\_21}}\left(\frac{_0P_4(S_{21})}{_0P_4(0)} - 1\right) + {_0H_{5\_21}}\left(\frac{_0P_5(S_{21})}{_0P_5(0)} - 1\right)$$

Equation 34

$$S_{22} = {_0H_{3\_22}}\left(\frac{_0P_3(S_{22})}{_0P_3(0)} - 1\right) + {_0H_{4\_22}}\left(\frac{_0P_4(S_{22})}{_0P_4(0)} - 1\right) + {_0H_{5\_22}}\left(\frac{_0P_5(S_{22})}{_0P_5(0)} - 1\right)$$

Figure 17:
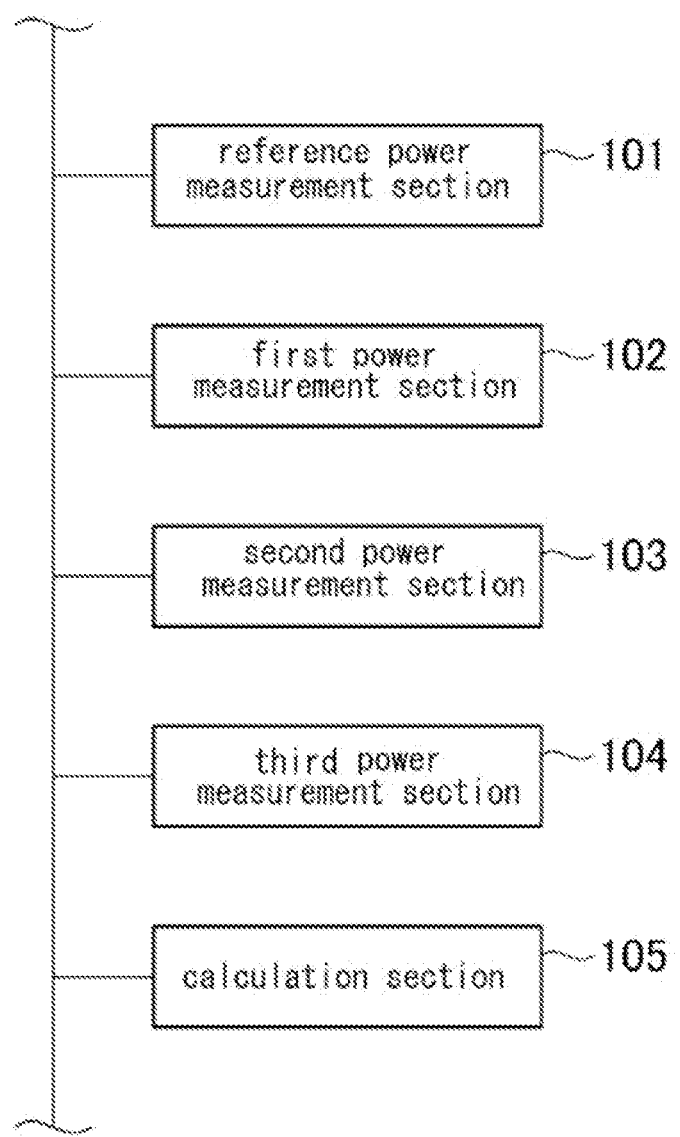
FIG. 17 is a block diagram showing an example of a system for realizing the measurement procedure of this embodiment.

Accordingly, with respect to a 5.1 port also, it is possible to measure S-parameters of a DUT in accordance with the procedure of FIG. 13, Also, an example of a system for realizing a measuring method of the above-described embodiment is shown in FIG. 17. This system is a system for measuring system parameters H3_11, H4_11, H5_11.

A reference power measurement section 101 receives input of measurement values P3(0), P4(0), P5(0) that were acquired by measuring output power at port 3, port 4 and port 5 where a specified wave is input to port 1, and port 2 is in a matched terminated state.

A first power measurement section 102 receives input of measurement values P3(S11_s[1]), P4(S11_s[1]), P5(S11_s[1]) that were acquired by measuring output power at port 3, port 4 and port 5 where the matched termination of port 2 is removed, a short standard is connected to port 2, another specified wave is input to the short standard, and a reflected wave of the other specified wave is input to port 2.

A second power measurement section 103 receives input of measurement values P3(S11_s[2]), P4(S11_s[2]), P5(S11_s[2]) that were acquired by measuring output power at port 3, port 4 and port 5 where a line 1 standard is inserted before the short standard of port 2, the other specified wave is input to the line 1 standard and the short standard, and a reflected wave of the other specified wave is input to port 2.

A third power measurement section 104 receives input of measurement values P3(S11_s[3]), P4(S11_s[3]), P5(S11_s[3]) that were acquired by measuring output power at port 3, port 4 and port 5 where a line 2 standard is inserted instead of the line 1 standard of port 2, the other specified wave is input to the line 2 standard and the short standard, and a reflected wave of the other specified wave is input to port 2.

A calculation section 105 calculates system parameters H3_11, H4_11, H5_11 as described above using the equation below. The calculation section 105 can be constituted by, for example, a suitable combination of computer program and hardware.

$$\begin{bmatrix} H_{3\_11} \\ H_{4\_11} \\ H_{5\_11} \end{bmatrix} = \begin{bmatrix} \sum_{i=1}^{n}\left(\frac{P_3(S_{11\_s}[i])}{P_3(0)} - 1\right)^2 & \sum_{i=1}^{n}\left(\frac{P_3(S_{11\_s}[i])}{P_3(0)} - 1\right)\left(\frac{P_4(S_{11\_s}[i])}{P_4(0)} - 1\right) & \sum_{i=1}^{n}\left(\frac{P_3(S_{11\_s}[i])}{P_3(0)} - 1\right)\left(\frac{P_5(S_{11\_s}[i])}{P_5(0)} - 1\right) \\ \sum_{i=1}^{n}\left(\frac{P_3(S_{11\_s}[i])}{P_3(0)} - 1\right)\left(\frac{P_4(S_{11\_s}[i])}{P_4(0)} - 1\right) & \sum_{i=1}^{n}\left(\frac{P_4(S_{11\_s}[i])}{P_4(0)} - 1\right)^2 & \sum_{i=1}^{n}\left(\frac{P_4(S_{11\_s}[i])}{P_4(0)} - 1\right)\left(\frac{P_5(S_{11\_s}[i])}{P_5(0)} - 1\right) \\ \sum_{i=1}^{n}\left(\frac{P_3(S_{11\_s}[i])}{P_3(0)} - 1\right)\left(\frac{P_5(S_{11\_s}[i])}{P_5(0)} - 1\right) & \sum_{i=1}^{n}\left(\frac{P_4(S_{11\_s}[i])}{P_4(0)} - 1\right)\left(\frac{P_5(S_{11\_s}[i])}{P_5(0)} - 1\right) & \sum_{i=1}^{n}\left(\frac{P_5(S_{11\_s}[i])}{P_5(0)} - 1\right)^2 \end{bmatrix}^{-1}$$

$$\begin{bmatrix} \sum_{i=1}^{n}\left(\frac{P_3(S_{11\_s}[i])}{P_3(0)} - 1\right)S_{11\_s}[i] \\ \sum_{i=1}^{n}\left(\frac{P_4(S_{11\_s}[i])}{P_4(0)} - 1\right)S_{11\_s}[i] \\ \sum_{i=1}^{n}\left(\frac{P_5(S_{11\_s}[i])}{P_5(0)} - 1\right)S_{11\_s}[i] \end{bmatrix}$$

equation 35

Each of the elements of the above-described embodiments is capable of exchanging data by means of an appropriate bus (refer to FIG. 17).

Further, the above described measurement methods can be realized using a computer program for processing measurement values at each port. Specifically, by inputting measurement values at each port to a computer, the computer can carry out the above-described calculation processing in accordance with the method of the above-described embodiments and acquire parameter H and S-parameters.

The present invention is not limited to the above-described embodiments, and it should be understood that various modifications are possible within the scope of invention disclosed in the appended patent claims, and these modifications are also included within the scope of the present invention.

Description of the Reference Numerals
  5PJ 5-port junction
  DC1, DC2 directional coupler
  DUT device under test
  PD power divider
  SW1, SW2 high frequency switch
  VS voltage source

The invention claimed is:

1. A system parameter measurement method for, in a linear multiport including a first input port and a second input port, and also including a third output port where an output wave that is a linear combination of an input wave from the first input port and an input wave from the second input port respectively appears, a fourth output port and a fifth output port ,-measuring system parameters $H3\_11$, $H4\_11$, and $H5\_11$ that are values inherent to the multiport, comprising:
  a reference power measurement step of inputting a specified wave to the first input port, measuring power of the third output port, the fourth output port and the fifth output port with the second input port in a matched terminated state, and respectively making the powers $P3(0)$, $P4(0)$ and $P5(0)$,
  a power measurement step of removing the matched termination of the second input port, connecting a short standard to the second input port, inputting another specified wave into the short standard, measuring power of the third output port, the fourth output port and the fifth output port with a reflected wave of the other specified wave input to the second input port, and respectively making the powers $P3(S11\_s[1])$, $P4(S11\_s[1])$ and $P5(S11\_s[1])$,
  a power measurement step of inserting a line 1 standard before the short standard of the second input port, inputting the other specified wave into the line 1 standard and the short standard, measuring power of the third output port, the fourth output port and the fifth output port with a reflected wave of the other specified wave input to the second input port, and respectively making the powers $P3(S11\_s[2])$, $P4(S11\_s[2])$ and $P5(S11\_s[2])$,
  a power measurement step of inserting a line 2 instead of the line 1 standard of the second input port, inputting the other specified wave to the line 2 standard and the short standard, measuring power of the third output port, the fourth output port and the fifth output port with a reflected wave of the other specified wave input to the second input port, and respectively making the powers $P3(S11\_s[3])$, $P4(S11\_s[3])$ and $P5(S11\_s[3])$, and
  a step of calculating system parameters $H3\_11$, $H4\_11$, $H5\_11$ from the following equation:

$$\begin{bmatrix} H_{3\_11} \\ H_{4\_11} \\ H_{5\_11} \end{bmatrix} = \begin{bmatrix} \sum_{i=1}^{n}\left(\frac{P_3(S_{11\_s}[i])}{P_3(0)}-1\right)^2 \\ \sum_{i=1}^{n}\left(\frac{P_3(S_{11\_s}[i])}{P_3(0)}-1\right)\left(\frac{P_4(S_{11\_s}[i])}{P_4(0)}-1\right) \\ \sum_{i=1}^{n}\left(\frac{P_3(S_{11\_s}[i])}{P_3(0)}-1\right)\left(\frac{P_5(S_{11\_s}[i])}{P_5(0)}-1\right) \end{bmatrix}$$

$$\begin{matrix} \sum_{i=1}^{n}\left(\frac{P_3(S_{11\_s}[i])}{P_3(0)}-1\right)\left(\frac{P_4(S_{11\_s}[i])}{P_4(0)}-1\right) \\ \sum_{i=1}^{n}\left(\frac{P_4(S_{11\_s}[i])}{P_4(0)}-1\right)^2 \\ \sum_{i=1}^{n}\left(\frac{P_4(S_{11\_s}[i])}{P_4(0)}-1\right)\left(\frac{P_5(S_{11\_s}[i])}{P_5(0)}-1\right) \end{matrix}$$

$$\begin{matrix} \sum_{i=1}^{n}\left(\frac{P_3(S_{11\_s}[i])}{P_3(0)}-1\right)\left(\frac{P_5(S_{11\_s}[i])}{P_5(0)}-1\right) \\ \sum_{i=1}^{n}\left(\frac{P_4(S_{11\_s}[i])}{P_4(0)}-1\right)\left(\frac{P_5(S_{11\_s}[i])}{P_5(0)}-1\right) \\ \sum_{i=1}^{n}\left(\frac{P_5(S_{11\_s}[i])}{P_5(0)}-1\right)^2 \end{matrix}^{-1}$$

$$\begin{bmatrix} \sum_{i=1}^{n}\left(\frac{P_3(S_{11\_s}[i])}{P_3(0)}-1\right)S_{11\_s}[i] \\ \sum_{i=1}^{n}\left(\frac{P_4(S_{11\_s}[i])}{P_4(0)}-1\right)S_{11\_s}[i] \\ \sum_{i=1}^{n}\left(\frac{P_5(S_{11\_s}[i])}{P_5(0)}-1\right)S_{11\_s}[i] \end{bmatrix}.$$

2. A non-transitory storage medium storing a computer program for the executing the calculating steps in claim 1 on a computer.

3. A system parameter measurement method for, in a linear multiport including a first input port and a second input port, a third output port at which an output wave that is a linear combination of an input wave from the first input port and an input wave from the second input port respectively appears, and a fourth output port and a fifth output port, measuring system parameters $H3\_12$, $H4\_12$, and $H5\_12$ that are values inherent to the multiport, comprising:
  a reference power measurement step of inputting a specified wave to the first input port, measuring power of the third output port, the fourth output port and the fifth output port with the second input port in a matched terminated state, and respectively making the powers $P3(0)$, $P4(0)$ and $P5(0)$, a power measurement step of removing the matched termination of the second input port, measuring power of the third output port, the fourth output port and the fifth output port with another specified wave input to the second input port, and respectively making the powers P3(S12_s[1]), P4(S12_s[1]) and P5(S12_s[1]), a power measurement step of connecting a line 1 standard to the second input port, measuring power of the third output port, the fourth output port and the fifth output port with a wave of the other specified wave input via the line 1 standard, and respectively making the powers P3(S12_s[2]), P4(S12_s[2]) and P5(S12_s[2]), and a power measurement step of connecting a line 2 standard instead of the line 1 standard of the second input port, measuring power of the third output port, the fourth output port and the fifth output port with a reflected wave of the other specified wave input via the line 2 standard, and respectively making the powers P3(S12_s[3]), P4(S12_s[3]) and P5(S12_s[3]), and a step of calculating system parameters H3_12, H4_12, H5_12 from the following equation:

port at which an output wave that is a linear combination of an input wave from the first input port and an input wave from the second input port appears, a fourth output port and a fifth output port, comprising:

a reference power measurement step of inputting a specified wave to the first input port, measuring power of the third output port, the fourth output port and the fifth output port with the second input port in a matched terminated state, and respectively making the powers P3(0), P4(0) and P5(0), a power measurement step of measuring power of the third output port, the fourth output port and the fifth output port with a wave that has been reflected by the device under test input to the second input port, and respectively making the powers P3(S11), P4(S11) and P5(Sll), and calculating a reflection characteristic Sll for the device under test based on P3(0), P4(0), and P5(0), P3(S11), P4(S11), and P5(S11), previously obtained parameters H3_11, H4_11, and H5_11, and the following equation:

$$\begin{bmatrix} H_{3\_12} \\ H_{4\_12} \\ H_{5\_12} \end{bmatrix} = \begin{bmatrix} \sum_{i=1}^{n}\left(\frac{P_3(S_{12\_s}[i])}{P_3(0)}-1\right)^2 & \sum_{i=1}^{n}\left(\frac{P_3(S_{12\_s}[i])}{P_3(0)}-1\right)\left(\frac{P_4(S_{12\_s}[i])}{P_4(0)}-1\right) & \sum_{i=1}^{n}\left(\frac{P_3(S_{12\_s}[i])}{P_3(0)}-1\right)\left(\frac{P_5(S_{12\_s}[i])}{P_5(0)}-1\right) \\ \sum_{i=1}^{n}\left(\frac{P_3(S_{12\_s}[i])}{P_3(0)}-1\right)\left(\frac{P_4(S_{12\_s}[i])}{P_4(0)}-1\right) & \sum_{i=1}^{n}\left(\frac{P_4(S_{12\_s}[i])}{P_4(0)}-1\right)^2 & \sum_{i=1}^{n}\left(\frac{P_4(S_{12\_s}[i])}{P_4(0)}-1\right)\left(\frac{P_5(S_{12\_s}[i])}{P_5(0)}-1\right) \\ \sum_{i=1}^{n}\left(\frac{P_3(S_{12\_s}[i])}{P_3(0)}-1\right)\left(\frac{P_5(S_{12\_s}[i])}{P_5(0)}-1\right) & \sum_{i=1}^{n}\left(\frac{P_4(S_{12\_s}[i])}{P_4(0)}-1\right)\left(\frac{P_5(S_{12\_s}[i])}{P_5(0)}-1\right) & \sum_{i=1}^{n}\left(\frac{P_5(S_{12\_s}[i])}{P_5(0)}-1\right)^2 \end{bmatrix}^{-1}$$

$$\begin{bmatrix} \sum_{i=1}^{n}\left(\frac{P_3(S_{12\_s}[i])}{P_3(0)}-1\right)S_{12\_s}[i] \\ \sum_{i=1}^{n}\left(\frac{P_4(S_{12\_s}[i])}{P_4(0)}-1\right)S_{12\_s}[i] \\ \sum_{i=1}^{n}\left(\frac{P_5(S_{12\_s}[i])}{P_5(0)}-1\right)S_{12\_s}[i] \end{bmatrix}.$$

4. A non-transitory storage medium storing a computer program for the executing the calculating steps in claim 3 on a computer.

5. A measuring method using a vector network analyzer for dividing a wave from a power supply for generating a high frequency signal, such as microwave band, millimeter wave band, sub-millimeter wave band or infra-red light, visible light or ultraviolet light, into two waves, inputting one wave to a first input port of a linear multiport having two input ports and at least three output ports, inputting the other wave to a device under test, and also inputting a wave transmitted through the device under test, or a wave reflected by the device under test, to a second input port of the linear multiport, measuring respective detected outputs for at least three power measurement output ports of the linear multiport in this state, and measuring vector quantities relating to the device under test based on those results, the linear multiport including the first input port and the second input port, a third output $$S_{11} = H_{3\_11}\left(\frac{P_3(S_{11})}{P_3(0)}-1\right) + H_{4\_11}\left(\frac{P_4(S_{11})}{P_4(0)}-1\right) + H_{5\_11}\left(\frac{P_5(S_{11})}{P_5(0)}-1\right).$$

6. A non-transitory storage medium storing a computer program for the executing the calculating steps in claim 5 on a computer.

7. A measuring method using a vector network analyzer for dividing a wave from a power supply for generating a high frequency signal, such as microwave band, millimeter wave band, sub-millimeter wave band or infra-red light, visible light or ultraviolet light, into two waves, inputting one wave to a first input port of a linear multiport having two input ports and at least three output ports, inputting the other wave to a device under test, and also inputting a wave transmitted through the device under test, or a wave reflected by the device under test, to a second input port of the linear multiport, measuring respective detected outputs for at least three power measurement output ports of the linear multiport in this state, and measuring vector quantities relating to the device under test based on those results, the linear multiport including the first input port and the second input port, a third output port at which an output wave that is a linear combination of an input wave from the first input port and an input wave from the second input port appears, a fourth output port and a fifth output port, comprising:

a reference power measurement step of inputting a specified wave to the first input port, measuring power of the third output port, the fourth output port and the fifth output port with the second input port in a matched terminated state, and respectively making the powers P3(0), P4(0) and P5(0), a power measurement step of measuring power of the third output port, the fourth output port and the fifth output port with a wave that has been transmitted through the device under test input to the second input port, and respectively making the powers P3(S12), P4(S12) and P5(S12), and calculating a transmission characteristic S12 for the device under test based on P3(0), P4(0), and P5(0), P3(S12), P4(S12), and P5(S12), previously obtained parameters H3_12, H4_12, and H5_12, and the following equation:

$$S_{12} = H_{3\_12}\left(\frac{P_3(S_{12})}{P_3(0)} - 1\right) + H_{4\_12}\left(\frac{P_4(S_{12})}{P_4(0)} - 1\right) + H_{5\_12}\left(\frac{P_5(S_{12})}{P_5(0)} - 1\right)$$

8. A non-transitory storage medium storing a computer program for the executing the calculating steps in claim 7 on a computer.

9. A system parameter measurement system for, in a linear multiport including a first input port and a second input port, a third output port where an output wave that is a linear combination of an input wave from the first input port and an input wave from the second input port respectively appears, and a fourth output port and a fifth output port, measuring system parameters H3_11, H4_11, and H5_11 that are values inherent to the multiport, comprising:

a reference power measurement section for receiving input of measurement values P3(0), P4(0) and P5(0) acquired by measuring power of the third output port, the fourth output port and the fifth output port, wherein a specified wave is input to the first input port and the second input port is in a matched terminated state, a first power measurement section for receiving input of measurement values P3(S_11 s[1]), P4(S11_s[1]) and P5(S11_s[1]) acquired by measuring power of the third output port, the fourth output port and the fifth output port, wherein the matched termination of the second input port is removed, a short standard is connected to the second input port, another specified wave is input into the short standard, and a reflected wave thereof is input to the second input port, a second power measurement section for receiving input of measurement values P3(S11_s[2]), P4(S11_s[2]) and P5(S11_s[2]) acquired by measuring power of the third output port, the fourth output port and the fifth output port, wherein a line 1 standard is inserted before the short standard of the second input port, the other specified wave is input into the line 1 standard and the short standard, and a reflected wave thereof is input to the second input port, a third power measurement section for receiving input of measurement values P3(S11_s[3]), P4(S11_s[3]) and P5(S11_s[3]) acquired by measuring power of the third output port, the fourth output port and the fifth output port, wherein a line 2 standard is inserted instead of the line 1 standard of the second input port, the other specified wave is input to the line 2 standard and the short standard, and a reflected wave thereof is input to the second input port, and a calculating section for calculating system parameters H3_11, H4_11, H5_11 from the following equation:

$$\begin{bmatrix} H_{3\_11} \\ H_{4\_11} \\ H_{5\_11} \end{bmatrix} = \begin{bmatrix} \sum_{i=1}^{n}\left(\frac{P_3(S_{11\_s}[i])}{P_3(0)} - 1\right)^2 & \sum_{i=1}^{n}\left(\frac{P_3(S_{11\_s}[i])}{P_3(0)} - 1\right)\left(\frac{P_4(S_{11\_s}[i])}{P_4(0)} - 1\right) & \sum_{i=1}^{n}\left(\frac{P_3(S_{11\_s}[i])}{P_3(0)} - 1\right)\left(\frac{P_5(S_{11\_s}[i])}{P_5(0)} - 1\right) \\ \sum_{i=1}^{n}\left(\frac{P_3(S_{11\_s}[i])}{P_3(0)} - 1\right)\left(\frac{P_4(S_{11\_s}[i])}{P_4(0)} - 1\right) & \sum_{i=1}^{n}\left(\frac{P_4(S_{11\_s}[i])}{P_4(0)} - 1\right)^2 & \sum_{i=1}^{n}\left(\frac{P_4(S_{11\_s}[i])}{P_4(0)} - 1\right)\left(\frac{P_5(S_{11\_s}[i])}{P_5(0)} - 1\right) \\ \sum_{i=1}^{n}\left(\frac{P_3(S_{11\_s}[i])}{P_3(0)} - 1\right)\left(\frac{P_5(S_{11\_s}[i])}{P_5(0)} - 1\right) & \sum_{i=1}^{n}\left(\frac{P_4(S_{11\_s}[i])}{P_4(0)} - 1\right)\left(\frac{P_5(S_{11\_s}[i])}{P_5(0)} - 1\right) & \sum_{i=1}^{n}\left(\frac{P_5(S_{11\_s}[i])}{P_5(0)} - 1\right)^2 \end{bmatrix}^{-1}$$

$$\begin{bmatrix} \sum_{i=1}^{n}\left(\frac{P_3(S_{11\_s}[i])}{P_3(0)} - 1\right) S_{11\_s}[i] \\ \sum_{i=1}^{n}\left(\frac{P_4(S_{11\_s}[i])}{P_4(0)} - 1\right) S_{11\_s}[i] \\ \sum_{i=1}^{n}\left(\frac{P_5(S_{11\_s}[i])}{P_5(0)} - 1\right) S_{11\_s}[i] \end{bmatrix}.$$

* * * * *

UNITED STATES PATENT AND TRADEMARK OFFICE
CERTIFICATE OF CORRECTION

| | |
|---|---|
| PATENT NO. | : 8,725,442 B2 |
| APPLICATION NO. | : 13/147575 |
| DATED | : May 13, 2014 |
| INVENTOR(S) | : Hajime Kondo et al. |

It is certified that error appears in the above-identified patent and that said Letters Patent is hereby corrected as shown below:

Title Page

Item (73):
"The University of Electro-Communications, Tokyo (JP); Campus Creat Co., Ltd., Tokyo (JP)" should read, --The University of Electro-Communications, Tokyo (JP); Campus Create Co., Ltd., Tokyo (JP)--.

In the Claims

Column 24, Line 13, Claim 9:
"measurement values P3(S_11 s[1]), P4(S11_s[1]) and" should read, --measurement values P3(S11_s[1]), P4(S11_s[1]) and--.

Signed and Sealed this
Seventeenth Day of February, 2015

Michelle K. Lee
*Deputy Director of the United States Patent and Trademark Office*